US011069530B2

(12) United States Patent
Meier et al.

(10) Patent No.: US 11,069,530 B2
(45) Date of Patent: *Jul. 20, 2021

(54) ETCHING PLATINUM-CONTAINING THIN FILM USING PROTECTIVE CAP LAYER

(71) Applicant: Texas Instruments Incorporated, Dallas, TX (US)

(72) Inventors: Sebastian Meier, Munich (DE); Helmut Rinck, Moosburg (DE); Mike Mittelstaedt, Berglern (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/688,060

(22) Filed: Nov. 19, 2019

(65) Prior Publication Data

US 2020/0083050 A1    Mar. 12, 2020

Related U.S. Application Data

(62) Division of application No. 15/714,169, filed on Sep. 25, 2017, now Pat. No. 10,504,733.

(Continued)

(51) Int. Cl.
*H01L 21/44* (2006.01)
*H01L 21/28* (2006.01)
(Continued)

(52) U.S. Cl.
CPC ........ *H01L 21/28052* (2013.01); *C01G 55/00* (2013.01); *C01G 55/004* (2013.01);
(Continued)

(58) Field of Classification Search
CPC . H01L 21/31122; H01L 28/24; H01L 29/665; H01L 21/02068; H01L 21/32139;
(Continued)

(56) References Cited

U.S. PATENT DOCUMENTS 4,804,438 A    2/1989 Rhodes
4,864,378 A    9/1989 Tsaur
(Continued)

OTHER PUBLICATIONS

Patent Cooperation Treaty Search Report, dated Aug. 2, 2018, International Application No. PCT/US 2018/014522.

(Continued)

*Primary Examiner* — Shouxiang Hu
(74) *Attorney, Agent, or Firm* — Jacqueline J. Garner; Charles A. Brill; Frank D. Cimino

(57) ABSTRACT

A microelectronic device is formed by forming a platinum-containing layer on a substrate of the microelectronic device. A cap layer is formed on the platinum-containing layer so that an interface between the cap layer and the platinum-containing layer is free of platinum oxide. The cap layer is etchable in an etch solution which also etches the platinum-containing layer. The cap layer may be formed on the platinum-containing layer before platinum oxide forms on the platinum-containing layer. Alternatively, platinum oxide on the platinum-containing layer may be removed before forming the cap layer. The platinum-containing layer may be used to form platinum silicide. The platinum-containing layer may be patterned by forming a hard mask or masking platinum oxide on a portion of the top surface of the platinum-containing layer to block the wet etchant.

17 Claims, 24 Drawing Sheets

Related U.S. Application Data

(60) Provisional application No. 62/448,138, filed on Jan. 19, 2017.

(51) Int. Cl.

| | |
|---|---|
| *H01L 21/311* | (2006.01) |
| *C01G 55/00* | (2006.01) |
| *H01L 21/263* | (2006.01) |
| *H01L 29/49* | (2006.01) |
| *H01L 21/3213* | (2006.01) |
| *H01L 21/02* | (2006.01) |
| *H01L 29/78* | (2006.01) |
| *H01L 29/66* | (2006.01) |
| *H01L 21/768* | (2006.01) |
| *H01L 21/285* | (2006.01) |
| *H01L 23/00* | (2006.01) |
| *H01L 49/02* | (2006.01) |
| *H01L 23/532* | (2006.01) |
| *H01L 21/8238* | (2006.01) |

(52) U.S. Cl.
CPC .... *H01L 21/02068* (2013.01); *H01L 21/2633* (2013.01); *H01L 21/28518* (2013.01); *H01L 21/31122* (2013.01); *H01L 21/32134* (2013.01); *H01L 21/32139* (2013.01); *H01L 21/76885* (2013.01); *H01L 21/76895* (2013.01); *H01L 23/53242* (2013.01); *H01L 24/00* (2013.01); *H01L 28/24* (2013.01); *H01L 29/4975* (2013.01); *H01L 29/665* (2013.01); *H01L 29/6659* (2013.01); *H01L 29/7833* (2013.01); *H01L 21/76834* (2013.01); *H01L 21/823814* (2013.01); *H01L 21/823835* (2013.01)

(58) Field of Classification Search
CPC .......... H01L 21/32134; H01L 21/2633; H01L 21/823835; H01L 21/823814; H01L 21/28052; H01L 21/28518; H01L 29/4975
See application file for complete search history.

(56) References Cited

U.S. PATENT DOCUMENTS

| | | | |
|---|---|---|---|
| 5,515,984 | A | 5/1996 | Yokoyama et al. |
| 6,455,403 | B1 * | 9/2002 | Hwang ............. H01L 21/76804 |
| | | | 257/E21.359 |
| 6,660,631 | B1 | 12/2003 | Marsh |
| 7,709,859 | B2 | 5/2010 | Smith et al. |
| 7,994,038 | B2 | 8/2011 | Ramani et al. |
| 10,504,733 | B2 * | 12/2019 | Meier .................. C01G 55/004 |
| 2006/0051961 | A1 | 3/2006 | Cabral, Jr. et al. |
| 2006/0284263 | A1 | 12/2006 | Chang et al. |
| 2009/0127594 | A1 | 5/2009 | Arunachalam et al. |
| 2009/0294871 | A1 * | 12/2009 | Besser ................ H01L 29/6659 |
| | | | 257/384 |
| 2012/0171864 | A1 | 7/2012 | Akiyama et al. |
| 2013/0115741 | A1 * | 5/2013 | Duong .................. C11D 11/007 |
| | | | 438/197 |

OTHER PUBLICATIONS

European Patent Office Search Report, dated Jan. 15, 2020, PCT/US 2018014522.

* cited by examiner

ETCHING PLATINUM-CONTAINING THIN FILM USING PROTECTIVE CAP LAYER

CROSS-REFERENCE TO RELATED APPLICATIONS

This application is a divisional of U.S. Nonprovisional patent application Ser. No. 15/714,169, filed Sep. 25, 2017, which claims the benefit of U.S. Provisional Application Ser. No. 62/448,138, filed Jan. 19, 2017, the contents of both of which are herein incorporated by reference in its entirety.

FIELD OF THE INVENTION

This invention relates to the field of microelectronic devices. More particularly, this invention relates to metal layers in microelectronic devices.

BACKGROUND OF THE INVENTION

It may be desirable to form a patterned layer of platinum-containing metal in a microelectronic device. Etching platinum-containing metal is difficult. Wet etching requires very strong acids such as aqua regia, and results in platinum-containing residue in the etched areas. Moreover, wet etching tends to be non-uniform, requiring significant overetch, which introduces unwanted variation in lateral dimensions of the patterned layer. Dry etching may be accomplished by sputter etching, also referred to as ion milling, but results in undesired redeposited platinum-containing material on the microelectronic device, which may reduce reliability of the microelectronic device. Furthermore, sputter etching may result in depositing unwanted platinum containing residue on interior surfaces of the sputter etching chamber, which may cause contamination on subsequently processed wafers. Sputter etching also has poor selectivity to materials in layers under the platinum-containing metal.

SUMMARY OF THE INVENTION

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A microelectronic device is formed by forming a platinum-containing layer on a substrate of the microelectronic device. A cap layer is formed on the platinum-containing layer so that an interface between the cap layer and the platinum-containing layer is free of platinum oxide. The cap layer is etchable in an etch solution which is used to etch the platinum-containing layer. In one aspect of the disclosure, the cap layer may be formed on the platinum-containing layer before the platinum-containing layer is exposed to an oxidizing ambient. In another aspect of the disclosure, platinum oxide on the platinum-containing layer may be removed before forming the cap layer. The cap layer and the platinum-containing layer are subsequently removed by a wet etch process.

In one aspect of the disclosure, a hard mask may be formed over a portion of the platinum-containing layer before forming the cap layer. The platinum oxide is removed from the platinum oxide where exposed by the hard mask before the cap layer is formed. A subsequent wet etch process using the etch solution removes the cap layer and removes the platinum-containing layer where exposed by the hard mask, leaving the platinum-containing layer in a patterned area.

In another aspect of the disclosure, the cap layer may be removed from over a portion of the platinum-containing layer, exposing the platinum-containing layer in a patterned area. Masking platinum oxide may then be formed on the exposed platinum-containing layer. A subsequent wet etch process using the etch solution removes the remaining cap layer and removes the platinum-containing layer under the cap layer, leaving the platinum-containing layer under the masking platinum oxide in a patterned area.

DETAILED DESCRIPTION OF EXAMPLE EMBODIMENTS

Figure 1A:
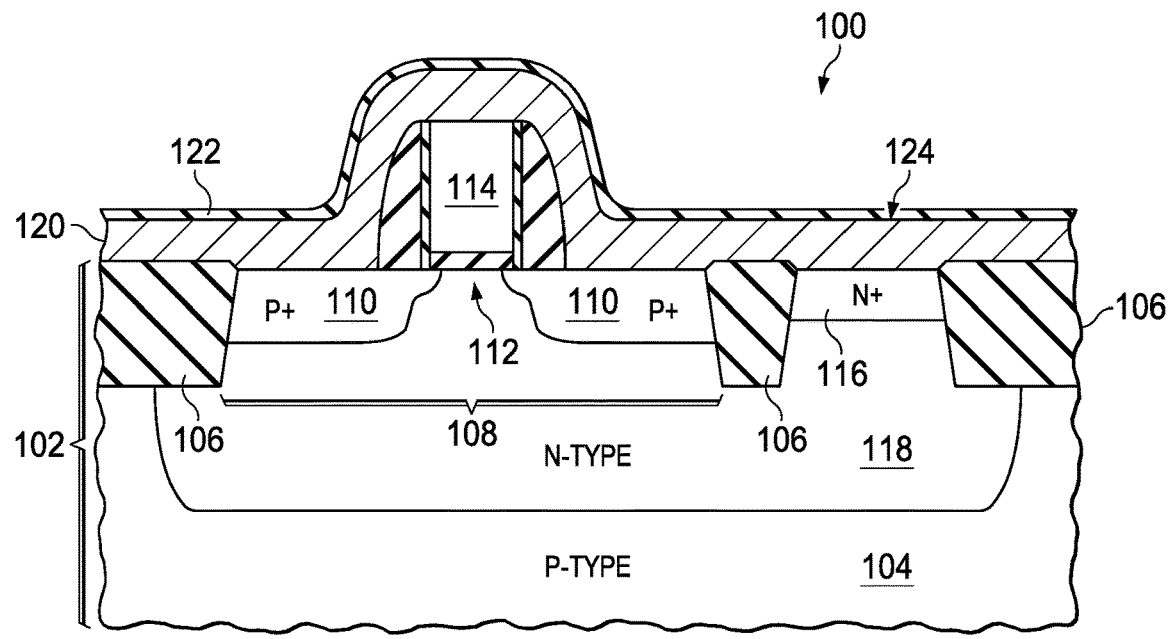
FIG. 1A through FIG. 1H are cross sections of a microelectronic device with a platinum-containing layer, depicted in successive stages of an example method of formation.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. The present invention is not limited by the illustrated ordering of acts or events, as some acts may occur in different orders and/or concurrently with other acts or events. Furthermore, not all illustrated acts or events are required to implement a methodology in accordance with the present invention.

A microelectronic device which includes a component having a platinum-containing layer may be formed by a method including forming the platinum-containing layer on an instant top surface of the microelectronic device. For the purposes of this disclosure, the term "instant top surface" of the microelectronic device is understood to refer to a top surface of the microelectronic device which exists at the particular step being disclosed. The identity of the instant top surface may change from step to step in the formation of the microelectronic device. At one step, the instant top surface may refer to exposed semiconductor material and exposed field oxide. At another step, the instant top surface may refer to a dielectric layer in an interconnect region. At a further step, the instant top surface may refer to a protective overcoat (PO) layer over the interconnect region.

In one implementation of the method, the platinum-containing layer may consist essentially of platinum. In another implementation, the platinum-containing layer may include primarily platinum, with some other metal such as iridium, rhodium, nickel, palladium, or a combination thereof.

A cap layer is formed on the platinum-containing layer. The cap layer is formed so that an interface between the cap layer and the platinum-containing layer is free of platinum oxide. For the purposes of this disclosure, the term "platinum oxide" is understood to refer to any stoichiometric or non-stoichiometric oxide of platinum, including, but not limited to, $PtO_2$, $Pt_3O_4$, PtO, and $PtO_3$. For the purposes of this disclosure, the term "native platinum oxide" is understood to refer to platinum oxide that forms on a platinum-containing layer as a result of exposure to air at a temperature normally encountered by wafers in a semiconductor fabrication facility, for example, from 20° C. to 50° C. Native platinum oxide may also form as a result of exposure of the platinum-containing layer to water at close to room temperature. Native platinum oxide has a low etch rate in wet etchants commonly used to etch platinum and platinum-containing materials in semiconductor fabrication processes. Moreover, native platinum oxide commonly does not totally block the wet etchants, so that native platinum oxide on a top surface of the platinum-containing layer commonly results in non-uniform etch of the platinum-containing layer, and may also result in platinum-containing residue on the microelectronic device.

In one implementation of the method, the cap layer may be formed on the platinum-containing layer before native platinum oxide forms on the platinum-containing layer, for example by forming the cap layer before the platinum-containing layer is exposed to an oxidizing ambient such as air. In another aspect of the disclosure, native platinum oxide on the platinum-containing layer may be removed before forming the cap layer on the platinum-containing layer.

The cap layer has a composition that provides that the cap layer is removed in a wet etch solution which also removes the platinum-containing layer. In one implementation of the method, the cap layer may include primarily aluminum. In one example, an aluminum-containing cap layer may include aluminum alone. In another example, an aluminum-containing cap layer may include metal used for etched aluminum interconnects in the microelectronic device, and so may include a few atomic percent of silicon, copper, titanium, or such. Such a composition for the cap layer may be advantageously implemented in a fabrication facility which forms etched aluminum interconnects. In another implementation of the method, the cap layer may include primarily copper, or may consist essentially of copper. Such a composition for the cap layer may be advantageously implemented in a fabrication facility which forms damascene copper interconnects, in which sputtered copper films are used for seed layers for copper electroplating processes.

The cap layer and the platinum-containing layer are subsequently removed by a wet etch process. The wet etch process may use an undiluted mixture of one part nitric acid ($HNO_3$) and three to four parts hydrochloric acid (HCl), commonly referred to as aqua regia. The wet etch process may use a mixture of nitric acid and hydrochloric acid, diluted by water. The wet etch process may use a mixture of nitric acid, hydrochloric acid, and phosphoric acid ($H_3PO_4$). Alternatively, the wet etch process may use a mixture of hydrogen peroxide and hydrochloric acid. Other formulations of an etch solution for the wet etch process are within the scope of this disclosure. The wet etch process may remove the cap layer and proceed into the platinum-containing layer uniformly across the microelectronic device, due to the absence of native platinum oxide at the interface between the cap layer and the platinum-containing layer. A uniform etch rate of the cap layer and the platinum-containing layer in the wet etch process may enable less overetch. The absence of native platinum oxide at the interface may also advantageously reduce platinum-containing residue on the microelectronic device, compared to a fabrication process in which native platinum oxide is present on the platinum-containing layer during the wet etch process.

FIG. 1A through FIG. 1H are cross sections of a microelectronic device with a platinum-containing layer, depicted in successive stages of an example method of formation. Referring to FIG. 1A, the microelectronic device 100 has a substrate 102 which includes semiconductor material 104 and field oxide 106. The field oxide 106 may have a shallow trench isolation (STI) structure, as depicted in FIG. 1A, or may have a local oxidation of silicon (LOCOS) structure. The microelectronic device 100 of the instant example includes a component 108, depicted in FIG. 1A as a p-channel metal oxide semiconductor (PMOS) transistor 108. The component 108 may have regions of the semiconductor material 104 extending to a top surface 112 of the substrate 102; in FIG. 1A, two of the regions 110 are depicted as p-type source and drain regions 110 of the PMOS transistor 108. In the instant example, the PMOS transistor 108 has a gate 114 which includes polycrystalline silicon that extends to an instant top surface of the microelectronic device 100. The microelectronic device 100 may include additional regions of the semiconductor material 104 that extend to the top surface 112 of the substrate, such as an n-type well contact region 116 which provides an electrical connection to an n-type well 118 that extends under the PMOS transistor 108. Other regions of semiconductor material extending to the top surface 112 of the substrate 102 or extending to the instant top surface of the microelectronic device 100, such as source and drain regions of an n-channel metal oxide semiconductor (NMOS) transistor, collector, base and emitter regions of a bipolar junction transistor, and substrate contact regions, are within the scope of the instant example.

A platinum-containing layer 120 is formed on an instant top surface of the microelectronic device 100, contacting exposed semiconductor material of the substrate 102 at the top surface 112 of the substrate 102, including the source and drain regions 110 of the PMOS transistor 108 and the well contact region 116. The platinum-containing layer 120 may also contact polycrystalline silicon in the gate 114 of the PMOS transistor 108, as depicted in FIG. 1A. In one version of the instant example, the platinum-containing layer 120 may consist essentially of platinum. In another version, the platinum-containing layer 120 may include primarily platinum, with 10 percent or less nickel or other metal. The platinum-containing layer 120 may have a thickness of 20 nanometers to 200 nanometers, for example. The platinum-containing layer 120 may be formed, for example, using a sputtering process, an evaporation process, or a metal organic chemical vapor deposition (MOCVD) process. Other processes for forming the platinum-containing layer 120 are within the scope of the instant example. The platinum-containing layer 120 has a top surface 124 located opposite from the top surface 112 of the substrate 102.

After the platinum-containing layer 120 is formed, the platinum-containing layer 120 may be exposed to an oxidizing ambient, such as air, for example by removing the substrate 102 from equipment in which the platinum-containing layer 120 was formed. Exposure to the oxidizing ambient may result in native platinum oxide 122 being formed on the top surface 124 of the platinum-containing layer 120. In the instant example, the top surface 124 is a surface of the platinum-containing layer 120 located opposite from a boundary between the platinum-containing layer 120 and the top surface 112 of the substrate 102. The native platinum oxide 122 may be, for example, one to two monolayers thick.

Figure 1B:
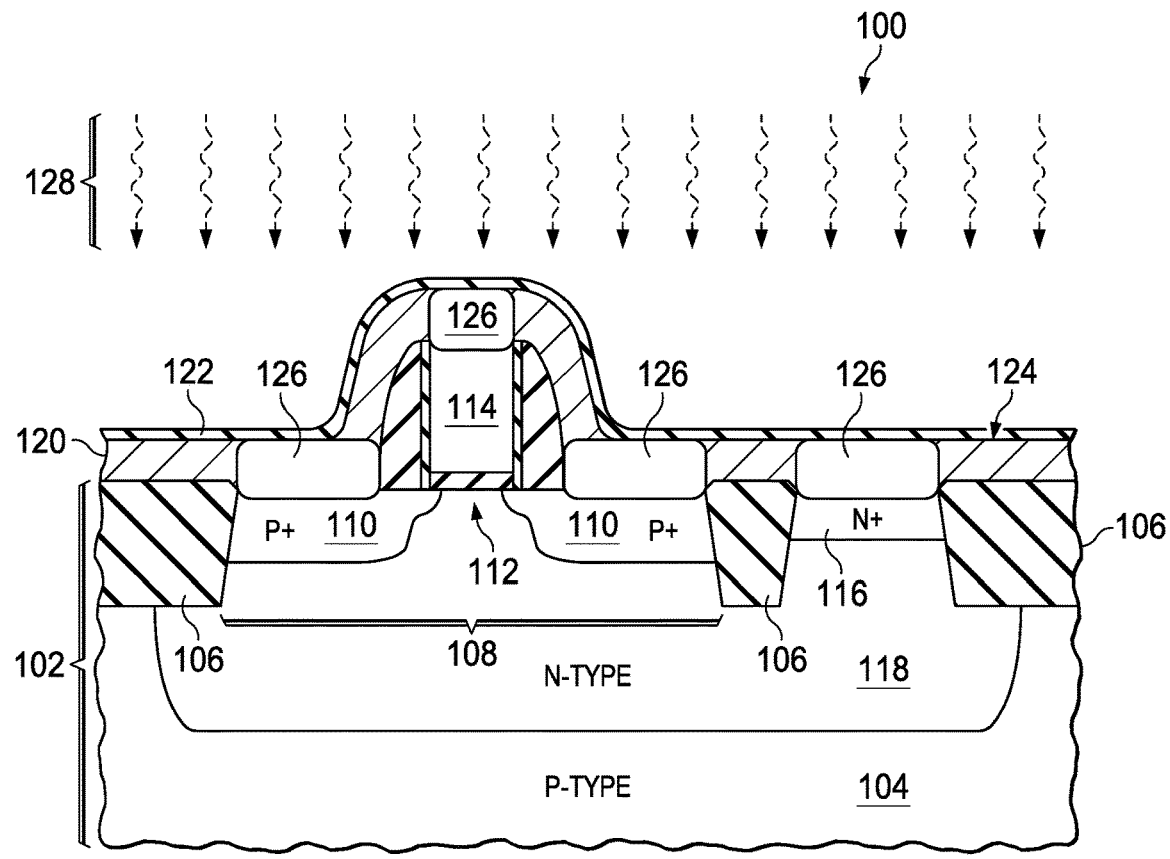

Referring to FIG. 1B, the substrate 102 and the platinum-containing layer 120 are heated, causing the platinum in the platinum-containing layer 120 to react with silicon in semiconductor material exposed at the top surface 112 of the substrate 102 to form platinum silicide 126 straddling the boundary between the platinum-containing layer 120 and the top surface 112 of the substrate 102.

In the instant example, the platinum silicide 126 is formed on the source and drain regions 110 of the PMOS transistor 108, and the well contact region 116, and optionally on the gate 114 of the PMOS transistor 108, as well as on other exposed semiconductor regions of the microelectronic device 100. The substrate 102 and the platinum-containing layer 120 may be heated, for example, by a radiant heating process 128, as depicted in FIG. 1B, in a rapid thermal processing tool, or by a furnace process. The native platinum oxide 122 may increase in thickness during the process of forming the platinum silicide 126, may decrease in thickness, or may not change thickness significantly, depending on ambient conditions while the substrate 102 and the platinum-containing layer 120 are heated. A thin layer of silicon dioxide may form over the platinum silicide 126 due to oxidation of silicon atoms.

Figure 1C:
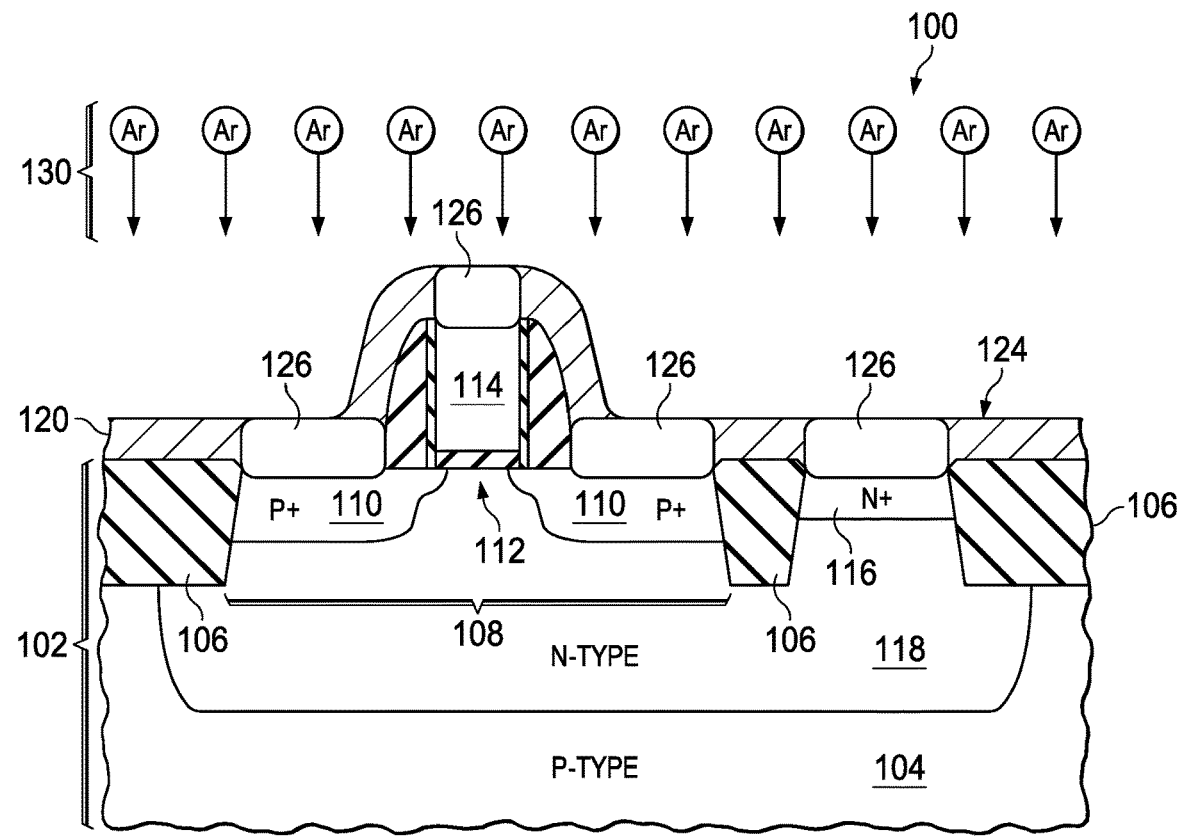

Referring to FIG. 1C, the microelectronic device 100 is exposed to a sputter etch process using ions 130, such as argon ions as depicted schematically in FIG. 1C. The ions 130 remove the native platinum oxide 122 of FIG. 1B, leaving the top surface 124 of the platinum-containing layer 120 free of platinum oxide. The sputter etch process may be continued for 3 seconds to 10 seconds, for example, to satisfactorily remove the native platinum oxide 122 from the top surface 124 of the platinum-containing layer 120. The sputter etch process is terminated before the thin layer of silicon dioxide over the platinum silicide 126 is removed.

Figure 1D:
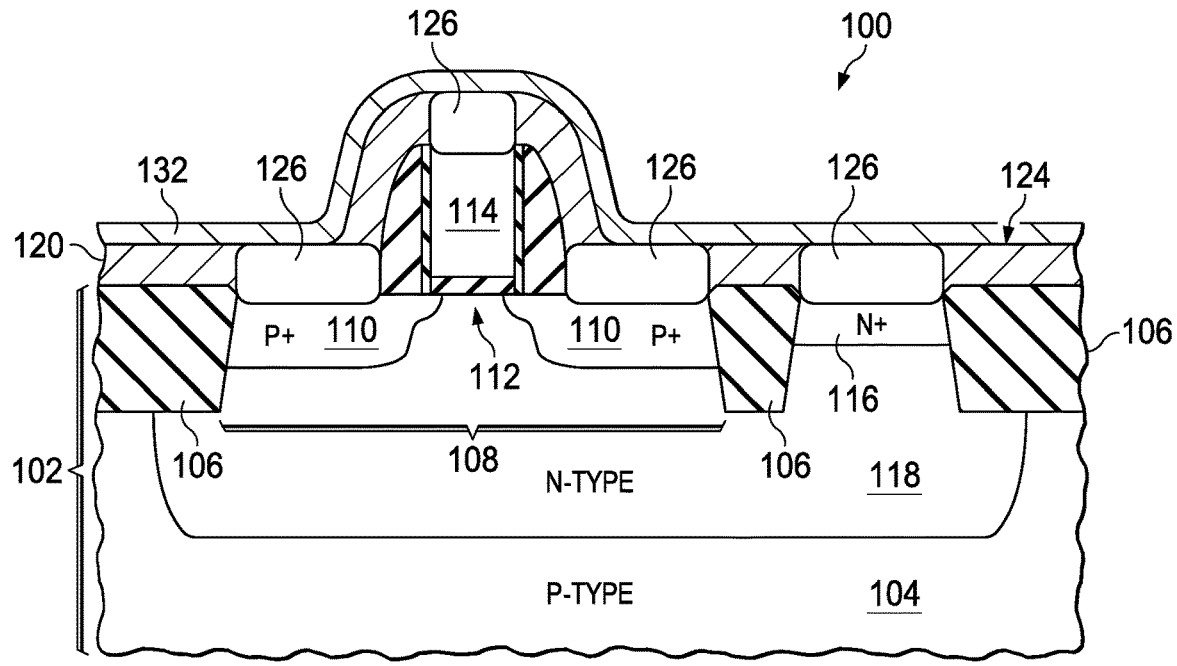

Referring to FIG. 1D, a cap layer 132 is formed on the top surface 124 of the platinum-containing layer 120, so that an interface between the cap layer 132 and the platinum-containing layer 120 is free of platinum oxide. This may be accomplished, for example, by forming the cap layer 132 without exposing the top surface 124 of the platinum-containing layer 120 to an oxidizing ambient after the native platinum oxide 122 of FIG. 1B is removed. In one version of the instant example, the native platinum oxide 122 may be removed and the cap layer 132 may be formed while in a single process tool, wherein the microelectronic device 100 is maintained in a non-oxidizing ambient throughout.

The cap layer 132 is etchable in a same wet etchant that is subsequently used to remove at least a portion of the platinum-containing layer 120. The cap layer 132 has an etch rate in the wet etchant that is at least twice an etch rate of the platinum-containing layer 120 in the wet etchant. In one version of the instant example, the cap layer 132 may include primarily aluminum, and may be formed, for example, by sputtering. For example, the cap layer 132 may have a composition similar to aluminum layers in etched aluminum interconnect lines of the microelectronic device 100, wherein the cap layer 132 includes at least 90 percent aluminum and has a few percent of silicon, titanium, copper, or such. In another version of the instant example, the cap layer 132 may consist essentially of aluminum, and may be formed, for example, by evaporation or sputtering. In a further version of the instant example, the cap layer 132 may include primarily copper, and may be formed, for example, by sputtering or evaporation. For example, the cap layer 132 may have a composition similar to copper seed layers in damascene copper interconnect lines of the microelectronic device 100.

The cap layer 132 has a thickness sufficient to provide uniform removal of the platinum-containing layer 120 across the microelectronic device 100. In one aspect of the instant example, this may be attained by a thickness sufficient to completely cover the top surface 124 of the platinum-containing layer 120. In another aspect, this may be attained by a thickness sufficient to prevent diffusion of oxidizers, such as oxygen gas ($O_2$) and water vapor ($H_2O$) from diffusing through the cap layer 132 to the top surface 124 of the platinum-containing layer 120. In a further aspect, this may be attained by a thickness sufficient to maintain a layer of unoxidized metal in the cap layer 132 until the platinum-containing layer 120 is removed by the wet etchant. In a version of the instant example in which the cap layer 132 includes primarily aluminum, the cap layer 132 may be at least 10 nanometers thick. In a version of the instant example in which the cap layer 132 includes primarily copper, the cap layer 132 may be at least 6 nanometers thick.

A thickness range of the cap layer 132 may be further affected by other considerations. In one aspect of the instant example, the cap layer 132 may be sufficiently thick to provide a desired process latitude for forming the cap layer 132, which may be attained by a thickness of 50 nanometers to 100 nanometers, depending on the process used to form the cap layer 132. In another aspect, the cap layer 132 may be sufficiently thick to provide a desired coverage on non-planar surfaces of the microelectronic device 100, such as on sides of the gate 114 of the PMOS transistor 108, which may be attained by a thickness of 100 nanometers to 150 nanometers, depending on the process used to form the cap layer 132. A thickness of the cap layer 132 greater than 150 nanometers is within the scope of the instant example.

The microelectronic device 100 may be stored or otherwise processed at this point, without forming platinum oxide at the top surface 124 of the platinum-containing layer 120. This may advantageously enable flexibility in a process sequence for forming the microelectronic device 100 by allowing varying wait times for subsequent process steps, and hence reducing an overall cost of operating a fabrication facility that is forming the microelectronic device 100.

Figure 1E:
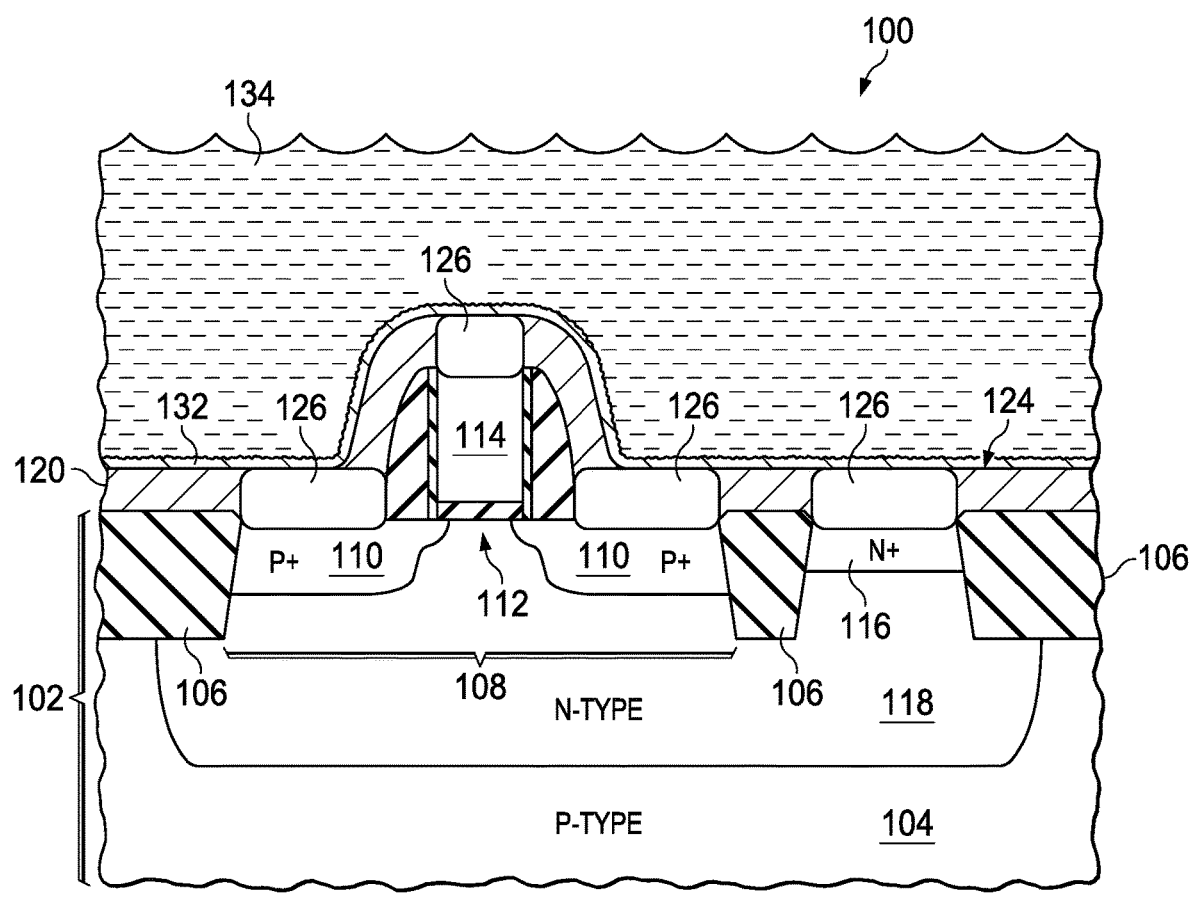

Referring to FIG. 1E, a wet etch process using a wet etchant 134 removes the cap layer 132. In one version of the instant example, the wet etchant 134 may be an undiluted mixture of one part nitric acid and three to four parts hydrochloric acid, which may provide a desired fast etch rate. In another version, the wet etchant 134 may be a mixture of nitric acid and hydrochloric acid, diluted by water, which may provide a lower etch rate, enabling tighter process control. In yet another version, the wet etchant 134 may be a mixture of nitric acid, hydrochloric acid, and phosphoric acid. In a further version, the wet etchant 134 may be a mixture of hydrogen peroxide and hydrochloric acid. Other formulations of the wet etchant 134 are within the scope of the instant example. FIG. 1E depicts the wet etch process partway through removal of the cap layer 132. The wet etch process is continued until the platinum-containing layer 120 is removed.

Figure 1F:
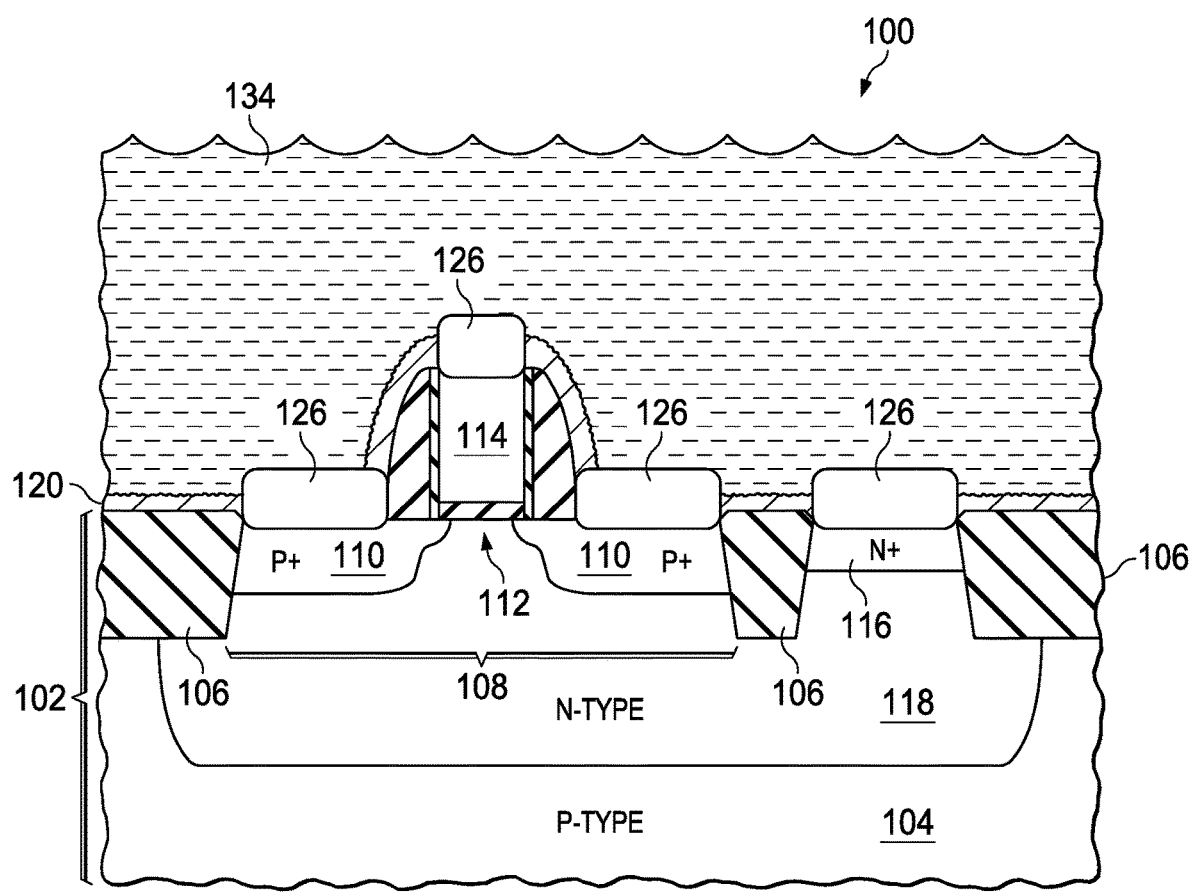

Referring to FIG. 1F, the wet etch process is continued so that the remaining cap layer 132 of FIG. 1E is completely removed and the wet etch process removes the platinum-containing layer 120. FIG. 1F depicts the wet etch process partway through removal of the platinum-containing layer 120. The wet etch process may proceed smoothly and uniformly through the cap layer 132 into the platinum-containing layer 120, because the top surface 124 of FIG. 1E of the platinum-containing layer 120 under the cap layer 132 was free of platinum oxide, as disclosed in reference to FIG. 1C and FIG. 1D. The wet etchant 134 may remove the platinum-containing layer 120 at a significantly lower rate than the cap layer 132, for example, 10 times to 100 times slower. The wet etch process does not remove the platinum silicide 126, as the thin layer of silicon dioxide over the platinum silicide 126 blocks the wet etchant 134.

Figure 1G:
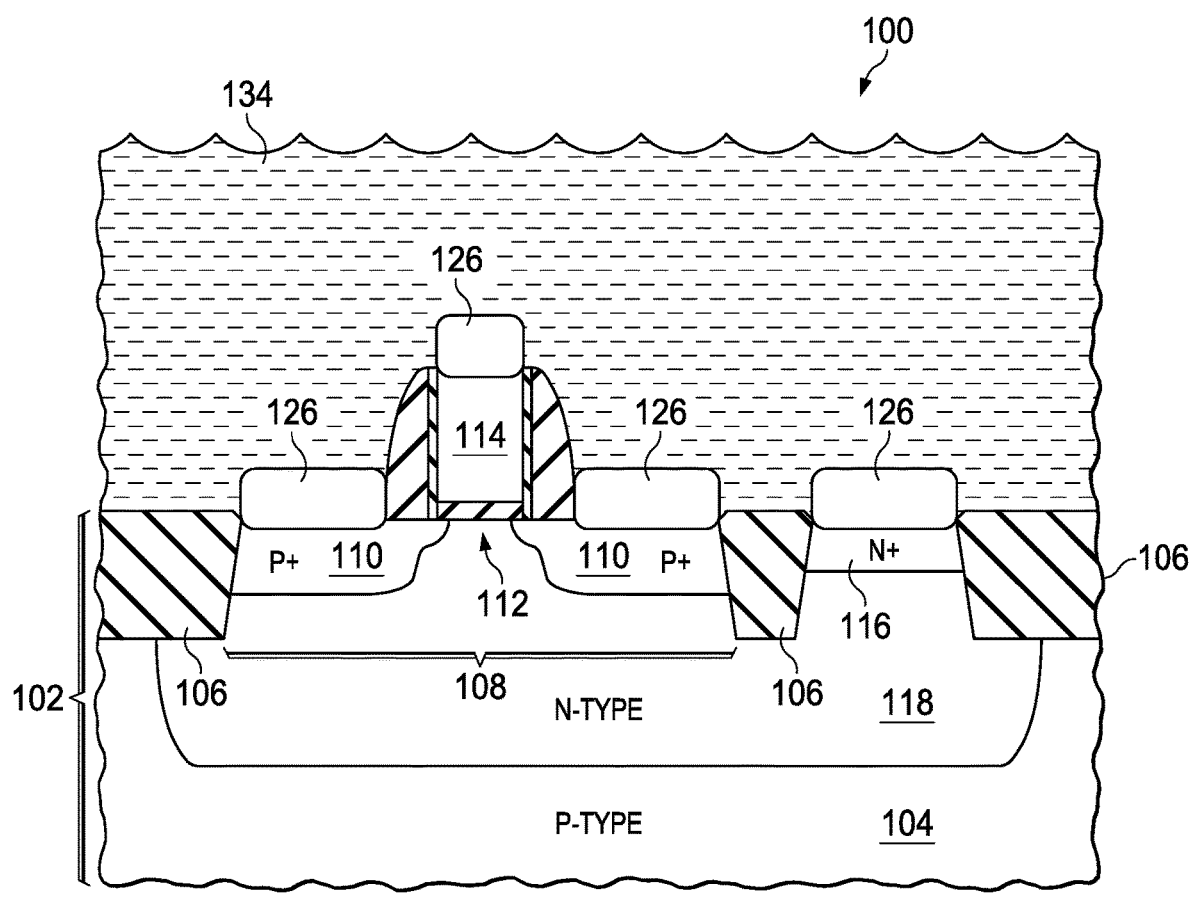

Referring to FIG. 1G, the wet etch process is continued so that the remaining platinum-containing layer 120 of FIG. 1F is completely removed. The wet etchant 134 may remove a portion of the platinum silicide 126; the wet etch process is terminated and the microelectronic device 100 is rinsed, leaving a sufficient amount, for example, 10 nanometers to 100 nanometers, of the platinum silicide 126 in place for proper functionality of the microelectronic device 100. The uniform removal of the platinum-containing layer 120 may advantageously enable a lower overetch time needed to remove the platinum-containing layer 120 from all areas of a wafer containing the microelectronic device 100, compared to a process sequence in which platinum oxide is present on the top surface of the platinum-containing layer 120. Because a portion of the platinum silicide 126 may be removed during the overetch, the reduced overetch time may provide a more consistent thickness of the platinum silicide 126 across the wafer containing the microelectronic device 100.

Figure 1H:
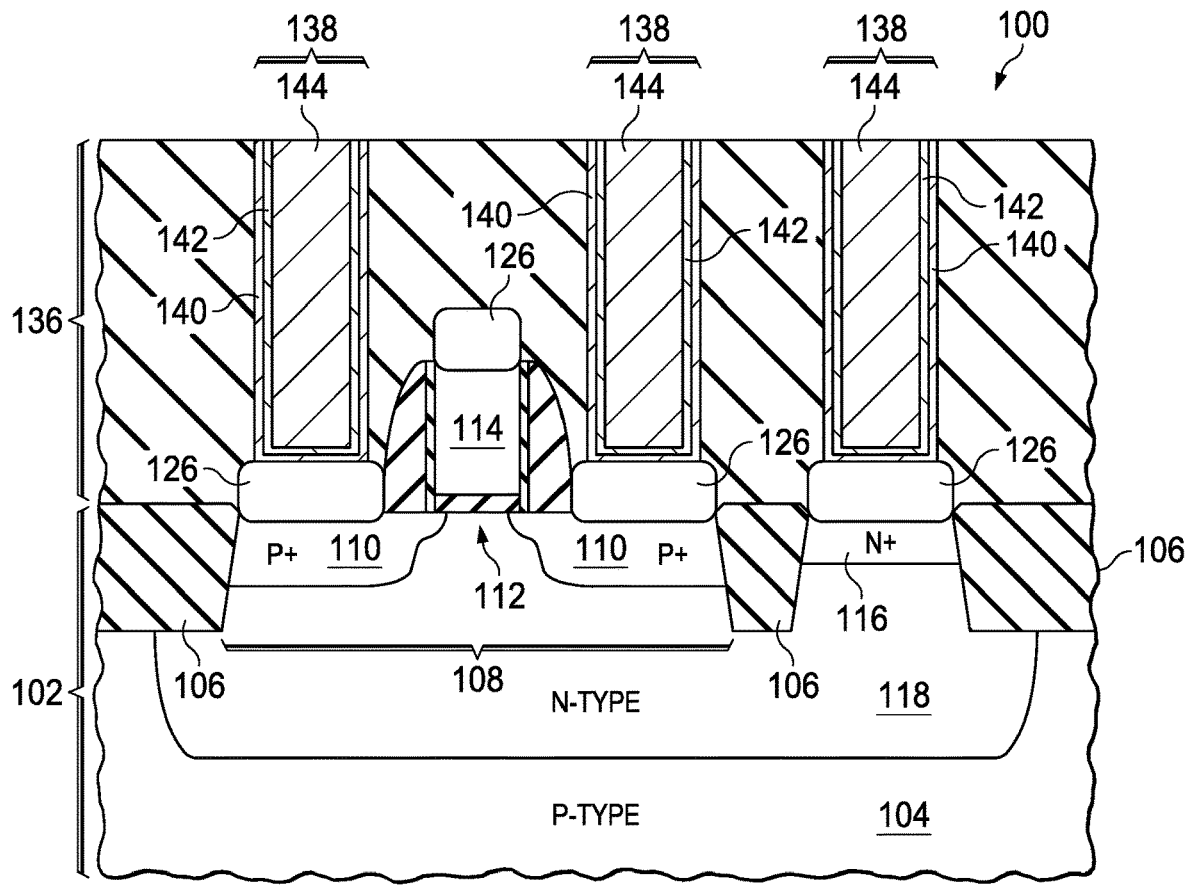

Referring to FIG. 1H, the top surface 112 of the substrate 102 may be advantageously free of platinum-containing residue, because the top surface 124 of FIG. 1E of the platinum-containing layer 120 under the cap layer 132 of FIG. 1E was free of platinum oxide; the presence of platinum oxide may lead to formation of platinum-containing residue.

A pre-metal dielectric (PMD) layer 136 may be formed over an instant top surface of the microelectronic device 100. The PMD layer 136 may include one or more sub-layers of dielectric material, for example, a PMD liner of silicon nitride, a layer of silicon dioxide-based material formed by a high density plasma or a chemical vapor deposition (CVD) process using tetraethyl orthosilicate (TEOS) and ozone, a layer of silicon dioxide-based material such as phosphosilicate glass (PSG) or borophosphosilicate glass (BPSG), and a cap layer of silicon nitride, silicon oxynitride, silicon carbide or silicon carbide nitride.

Contacts 138 may be formed through the PMD layer 136 to make electrical connections to the platinum silicide 126. The contacts 138 may be formed by etching contact holes through the PMD layer 136, and forming a titanium liner 140, by sputtering or an ionized metal plasma (IMP) process, on the PMD layer 136 and extending into the contact holes. A titanium nitride liner 142 may be formed, by reactive sputtering or atomic layer deposition (ALD), on the titanium liner. A layer of tungsten 144 may then be formed by an MOCVD process on the titanium nitride liner, filling the contact holes. The tungsten 144, the titanium nitride liner 142, and the titanium liner 140 are removed from over a top surface of the PMD layer 136 by a tungsten CMP process, leaving the tungsten 144, the titanium nitride liner 142, and the titanium liner 140 in the contact holes to provide the contacts 138.

Figure 2A:
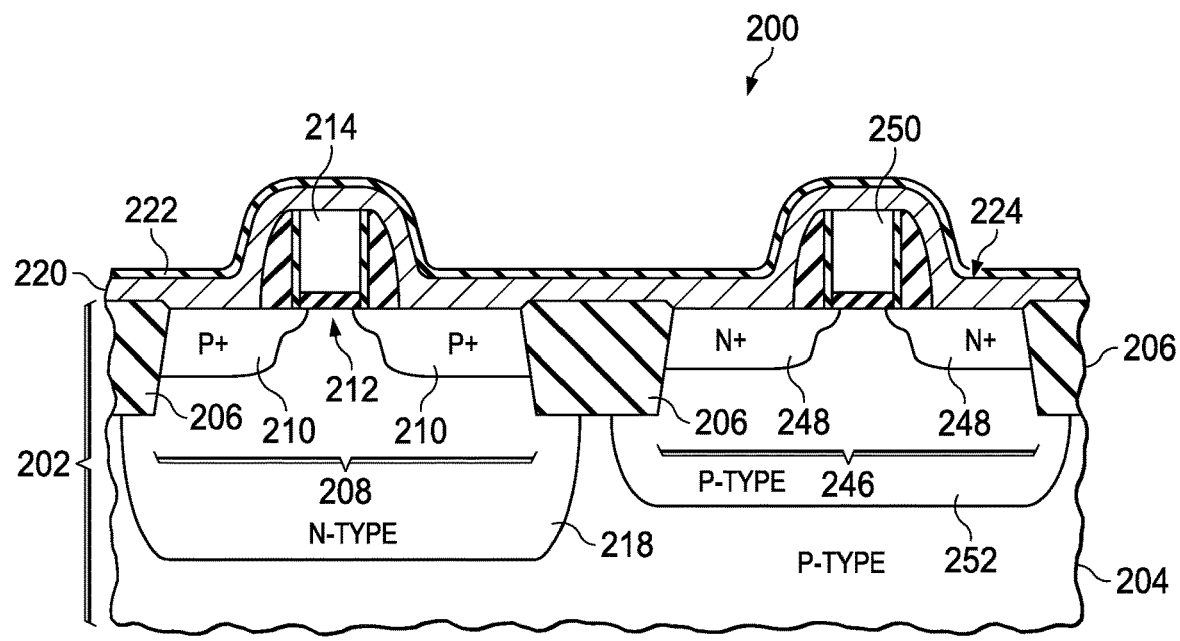
FIG. 2A through FIG. 2H are cross sections of a microelectronic device with a platinum-containing layer, depicted in successive stages of another example method of formation.

FIG. 2A through FIG. 2H are cross sections of a microelectronic device with a platinum-containing layer, depicted in successive stages of another example method of formation. Referring to FIG. 2A, the microelectronic device 200 has a substrate 202 which includes semiconductor material 204 and field oxide 206. The microelectronic device 200 of the instant example includes a first component 208, depicted in FIG. 2A as a PMOS transistor 208, with p-type source and drain regions 210 extending to a top surface 212 of the substrate 202, and a gate 214 which includes polycrystalline silicon. The microelectronic device 200 of the instant example further includes a second component 246, depicted in FIG. 2A as an NMOS transistor 246, with n-type source and drain regions 248 extending to the top surface 212 of the substrate 202, and a gate 250 which includes polycrystalline silicon. The substrate 202 may include an n-type well 218 under the PMOS transistor 208, and a p-type well 252 under the NMOS transistor 246. Other regions of semiconductor material extending to the top surface 212 of the substrate 202 or extending to the instant top surface of the microelectronic device 200, well contact regions, collector, base and emitter regions of a bipolar junction transistor, and substrate contact regions, are within the scope of the instant example.

A platinum-containing layer 220 is formed on an instant top surface of the microelectronic device 200, contacting exposed semiconductor material of the substrate 202 at the top surface 212, including the source and drain regions 210 of the PMOS transistor 208 and the source and drain regions 248 of the NMOS transistor 246. The platinum-containing layer 220 may also contact polycrystalline silicon in the gate 214 of the PMOS transistor 208 and in the gate 250 of the NMOS transistor 246, as depicted in FIG. 2A. The platinum-containing layer 220 may consist essentially of platinum, or may include primarily platinum, and less than 10 percent of another metal or metals. The platinum-containing layer 220 may have a thickness of 20 nanometers to 200 nanometers, for example. Native platinum oxide 222 is present on a top surface 224 of the platinum containing layer 220.

Figure 2B:
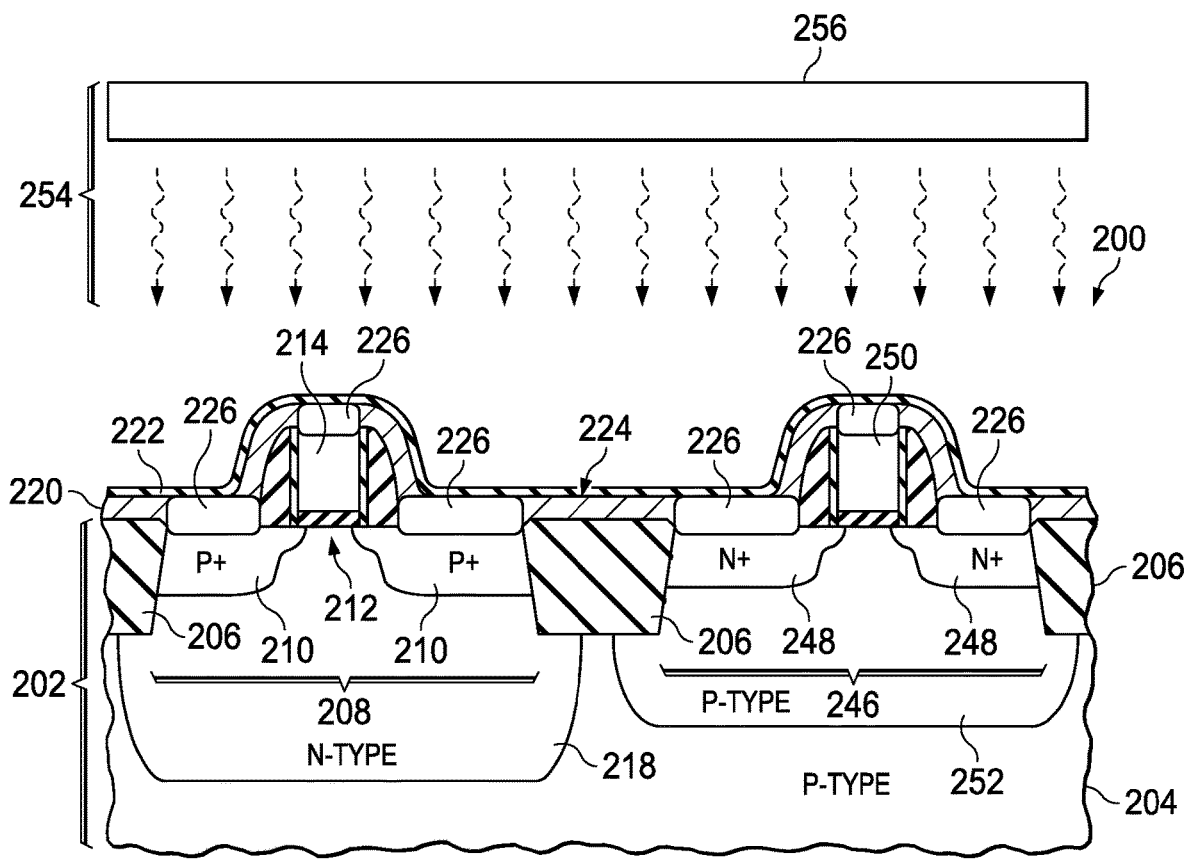
Figure 2B:
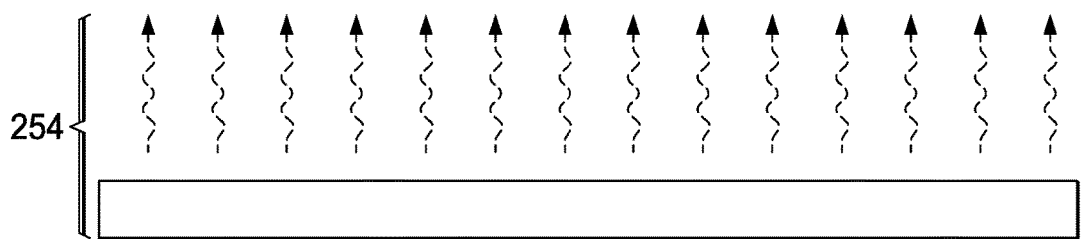

Referring to FIG. 2B, the substrate 202 and the platinum-containing layer 220 are heated, causing the platinum in the platinum-containing layer 220 to react with silicon in semiconductor material exposed at the top surface 212 of the substrate 202 to form platinum silicide 226 straddling the boundary between the platinum-containing layer 220 and the top surface 212 of the substrate 202. In the instant example, the platinum silicide 226 is formed on the source and drain regions 210 of the PMOS transistor 208 and the source and drain regions 248 of the NMOS transistor 246, and optionally on the gate 214 of the PMOS transistor 208 and on the gate 250 of the NMOS transistor 246. The substrate 202 and the platinum-containing layer 220 may be heated, for example, by a furnace process 254 as indicated in FIG. 2C by furnace walls 256, or by a radiant heating process in a rapid thermal processing tool, or by another heating process.

Figure 2C:
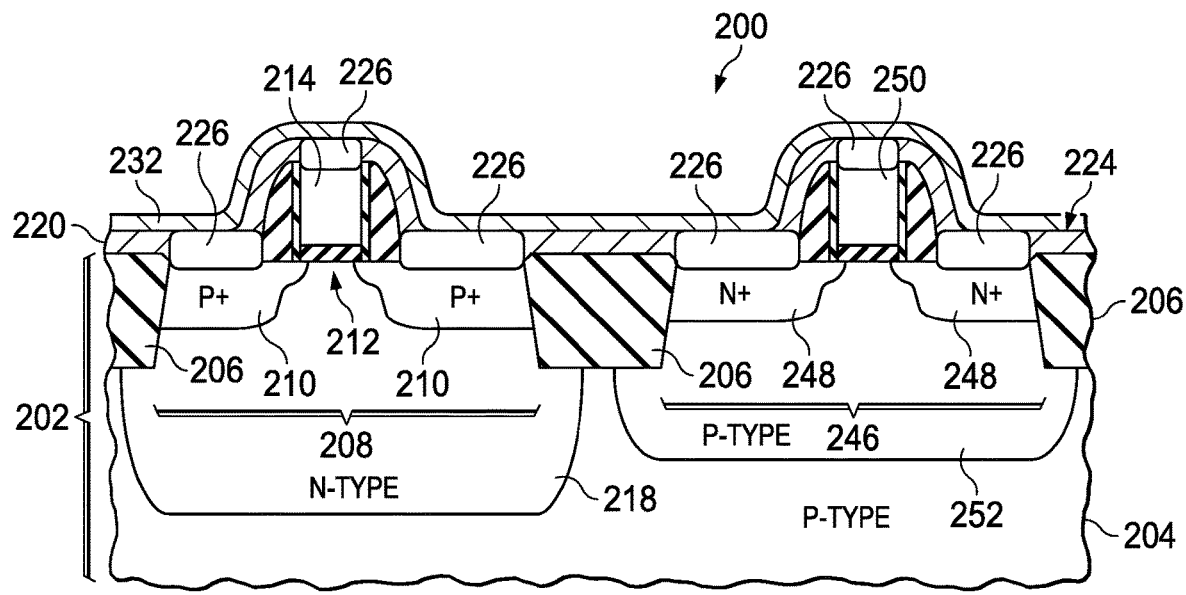

Referring to FIG. 2C, the native platinum oxide 222 of FIG. 2B is removed, for example by a sputter etch process as disclosed in reference to FIG. 1C. Alternatively, the native platinum oxide 222 may be removed by another process, such as heating the platinum containing layer 220 in a vacuum. A cap layer 232 is formed on the top surface 224 of the platinum-containing layer 220, so that an interface between the cap layer 232 and the platinum-containing layer 220 is free of platinum oxide. In the instant example, this may be accomplished by forming the cap layer 232 without exposing the top surface 224 of the platinum-containing layer 220 to an oxidizing ambient after removing the native platinum oxide 222. The cap layer 232 is etchable in a same wet etchant that is subsequently used to remove at least a portion of the platinum-containing layer 220. The cap layer 232 may have a composition and thickness as disclosed in reference to FIG. 1D, and may be formed by any of the processes disclosed in reference to FIG. 1D.

Figure 2D:
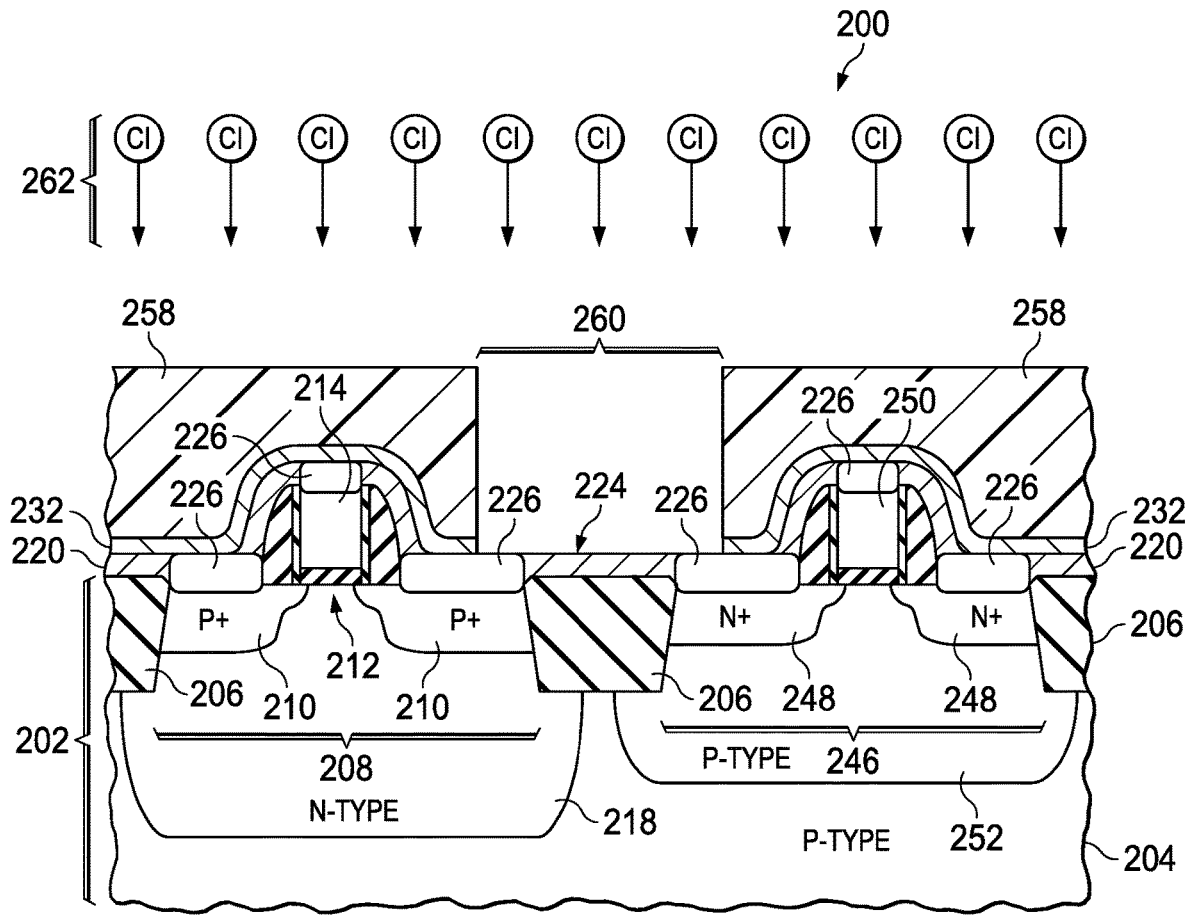

Referring to FIG. 2D, an etch mask 258 is formed over the cap layer 232. The etch mask 258 exposes an area 260 for a local interconnect between one of the source and drain regions 210 of the PMOS transistor 208 and one of the source and drain regions 248 of the NMOS transistor 246. The etch mask 258 may further expose additional areas for additional local interconnects. The etch mask 258 may include photoresist, formed by a photolithographic process, and may optionally include an anti-reflection layer, such as a bottom anti-reflection coat (BARC). Alternatively, the etch mask 258 may include hard mask material, such as silicon dioxide, silicon nitride, amorphous carbon, or the like.

The cap layer 232 is removed in the areas exposed by the etch mask 258, exposing the top surface 224 of the platinum-containing layer 220. In a version of the instant example in which the cap layer 232 includes aluminum, the cap layer 232 may be removed by a reactive ion etch (RIE) process using chlorine ions 262, as depicted in FIG. 2D. In a version of the instant example in which the cap layer 232 includes aluminum, the cap layer 232 may be removed by a wet etch. Other processes for removing the cap layer 232 in the areas exposed by the etch mask 258 are within the scope of the instant example.

The etch mask 258 is subsequently removed, for example by a plasma process using oxygen radicals, such as an asher process. Alternatively, the etch mask 258 may be removed by a combination of a wet clean process and an oxygen plasma process. Removal of the etch mask 258 may result in a layer of platinum oxide forming on the top surface 224 of the platinum-containing layer 220 in the areas where the cap layer 232 has been removed.

Figure 2E:
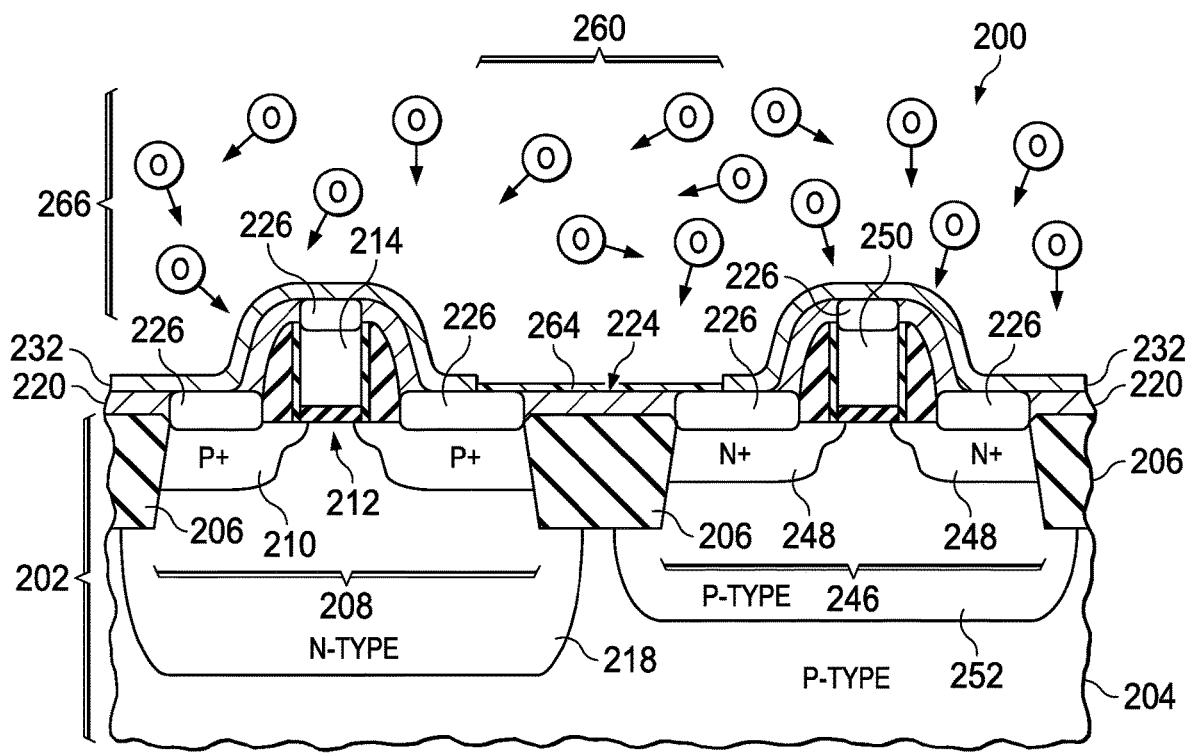

Referring to FIG. 2E, masking platinum oxide 264 is formed on the top surface 224 of the platinum-containing layer 220 where exposed by the cap layer 232. For the purposes of this disclosure, the term "masking platinum oxide" refers to platinum oxide which is intentionally formed to be sufficiently continuous and sufficiently thick to block a wet etchant that is subsequently used to etch the platinum-containing layer 220. A portion or all of the masking platinum oxide 264 may be formed by the process used to remove the etch mask 258 of FIG. 2D. If additional masking platinum oxide 264 is desired, the microelectronic device 200 may be exposed to an oxidizing ambient 266 such as an oxygen plasma, as depicted schematically in FIG. 2E, oxygen at an elevated temperature, ozone activated by ultraviolet light, carbon monoxide (CO), or the like, after the etch mask 258 is removed. The masking platinum oxide 264 may extend onto the platinum silicide 226 where exposed by the cap layer 232, as depicted in FIG. 2E.

Figure 2F:
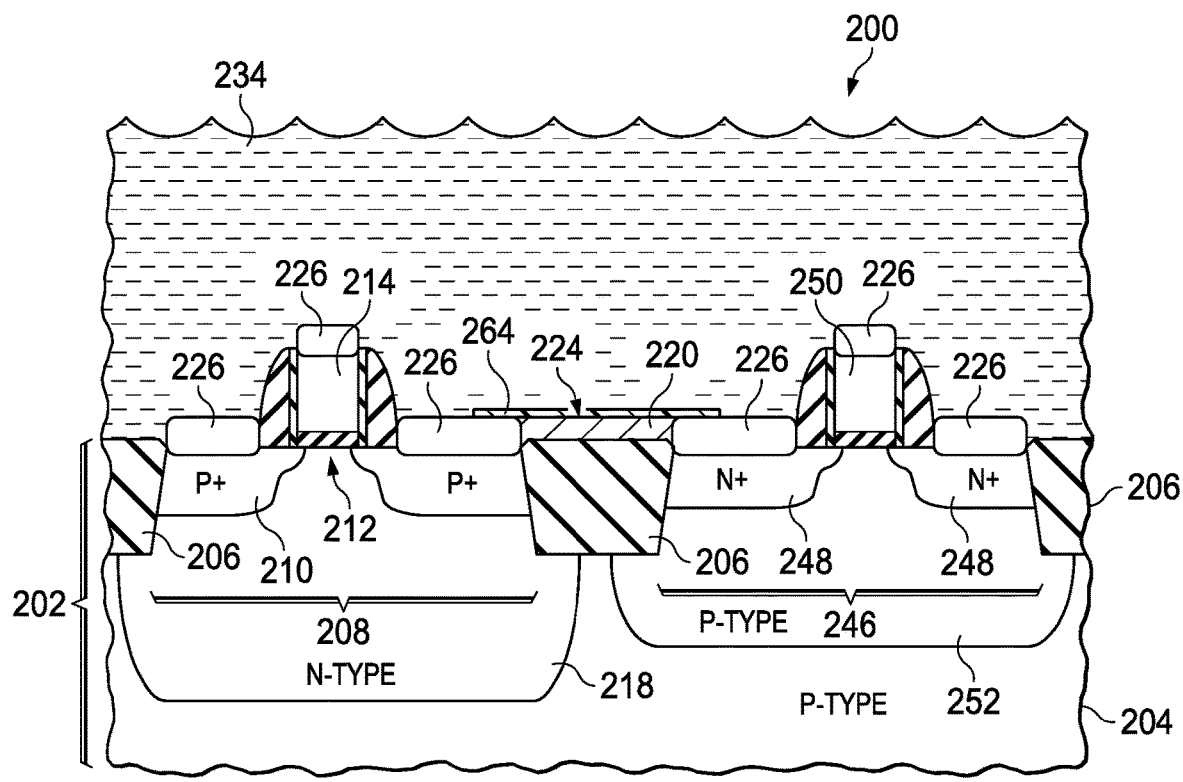

Referring to FIG. 2F, a wet etch process using a wet etchant 234 removes the cap layer 232 of FIG. 2E, and removes the platinum-containing layer 220 where exposed by the masking platinum oxide 264, as described in reference to FIG. 1E through FIG. 1G. The wet etchant 234 may have any of the compositions disclosed in reference to FIG. 1E. FIG. 2F depicts the microelectronic device 200 at the completion of the wet etch process. The masking platinum oxide 264 prevents the wet etchant 234 from removing the platinum-containing layer 220 under the masking platinum oxide 264, because the masking platinum oxide 264 has a very low etch rate in the wet etchant 234.

Figure 2G:
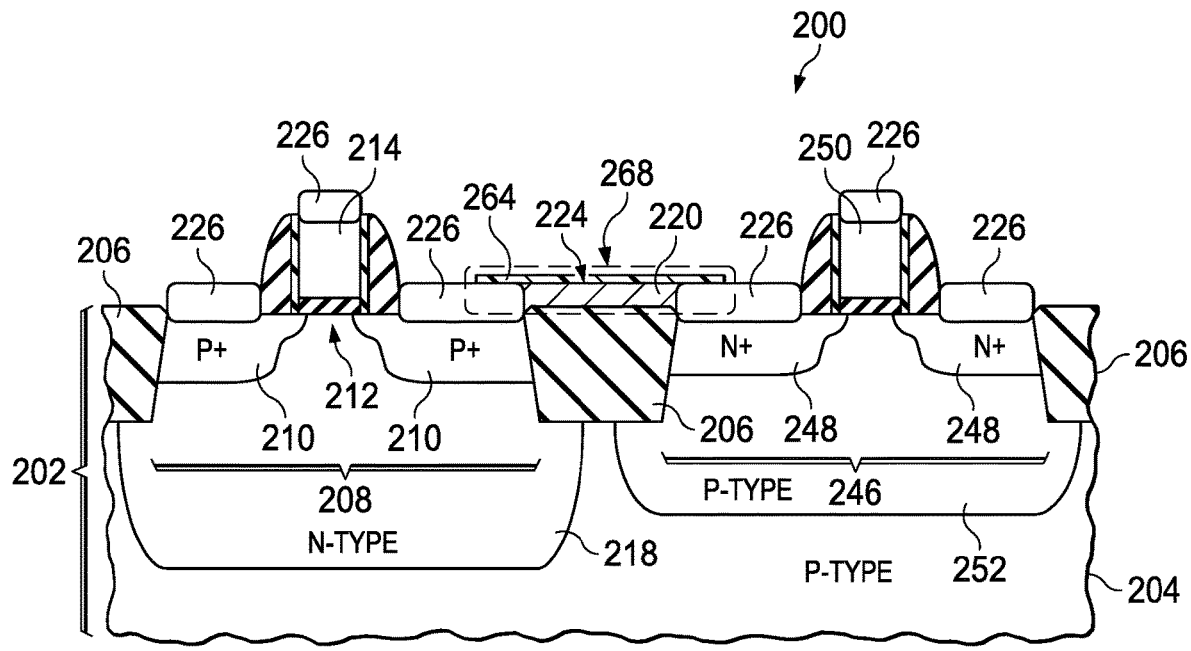

FIG. 2G depicts the microelectronic device 200 after the wet etch process of FIG. 2F is completed, The remaining platinum-containing layer 220 provides the local interconnect 268 which electrically connects the platinum silicide 226 on one of the source and drain regions 210 of the PMOS transistor 208 and the platinum silicide 226 on one of the source and drain regions 248 of the NMOS transistor 246. Forming the local interconnect 268 from the platinum-containing layer 220 which was used to form the platinum silicide 226 may provide a low contact resistance between the local interconnect 268 and the platinum silicide 226, thus advantageously providing a low resistance for the electrical connection between the one of the source and drain regions 210 of the PMOS transistor 208 and the one of the source and drain regions 248 of the NMOS transistor 246.

Figure 2H:
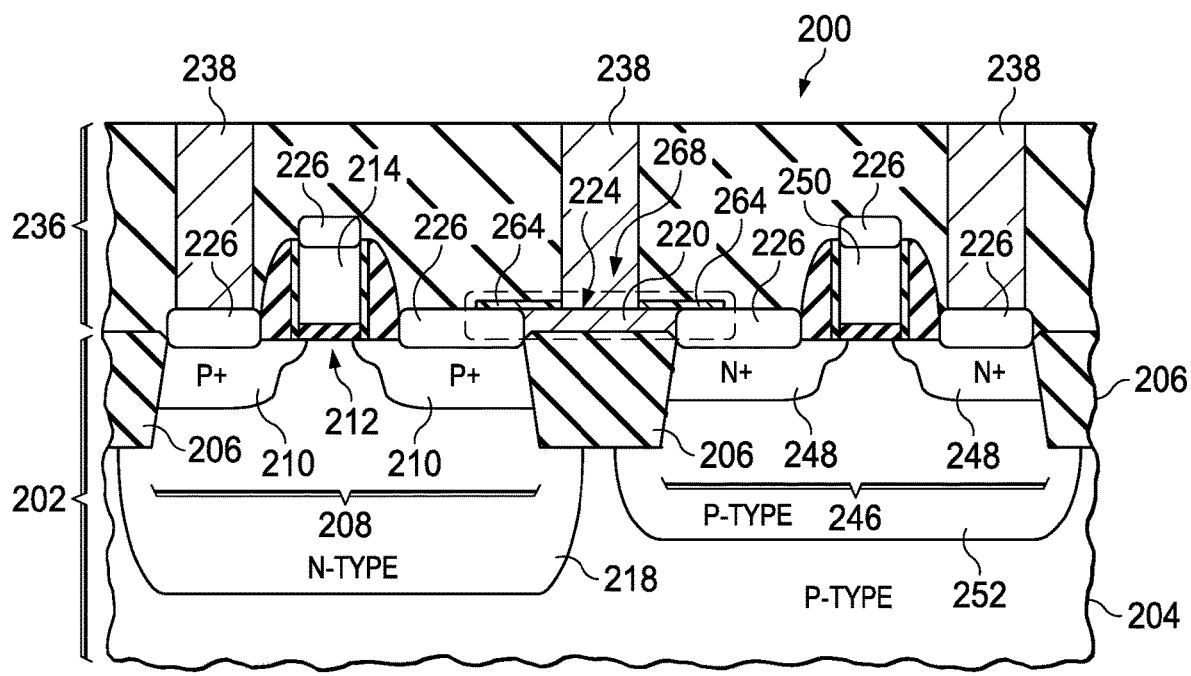

Referring to FIG. 2H, a PMD layer 236 may be formed over an instant top surface of the microelectronic device 200. Contacts 238 may be formed through the PMD layer 236 to make electrical connections to the platinum silicide 226. The PMD layer 236 and the contacts 238 may have similar structures to those disclosed in reference to FIG. 1H. The platinum silicide 226 may be free of platinum-containing residue, which may advantageously provide consistent resistance between the contacts 238 and the platinum silicide 226. In the instant example, one or more of the contacts 238 may be formed on the local interconnect 268, as depicted in FIG. 2H. During formation of the contacts 238, the masking platinum oxide 264 on the local interconnect 268 is removed by the process of forming contacts holes, and by a subsequent sputter etch process before depositing contact metal in the contact holes, to provide a low resistance between the contacts 238 and the local interconnect 268.

Figure 3A:
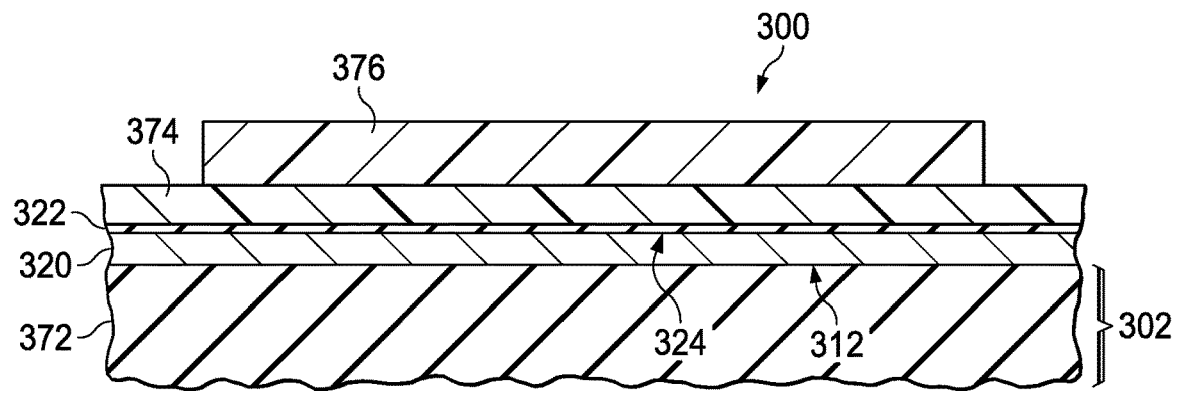
FIG. 3A through FIG. 3F are cross sections of a microelectronic device with a platinum-containing layer, depicted in successive stages of a further example method of formation.

FIG. 3A through FIG. 3F are cross sections of a microelectronic device with a platinum-containing layer, depicted in successive stages of a further example method of formation. Referring to FIG. 3A, the microelectronic device 300 has a substrate 302 which may include a dielectric material 372 extending to a top surface 312 of the substrate 302. The dielectric material 372 may include, for example, field oxide, a PMD layer, an inter-metal dielectric (IMD) layer between interconnect lines in a same metallization level, or an intra-level dielectric (ILD) layer between metallization levels. Other dielectric layers of the microelectronic device 300 extending to the top surface 312 of the substrate 302 are within the scope of the instant example. A platinum-containing layer 320 is formed over the top surface 312 of the substrate 302. An optional adhesion layer, either electrically conductive or electrically non-conductive, not shown in FIG. 3A, formed over the top surface 312 of the substrate 302 prior to forming the platinum-containing layer 320, is within the scope of the instant example.

In one version of the instant example, the platinum-containing layer 320 may consist essentially of platinum. In another version, the platinum-containing layer 320 may include at least 50 percent platinum, with the remainder comprising nickel, rhodium, rhenium, palladium, iridium, or the like. The platinum-containing layer 320 may have a thickness of 20 nanometers to 2 microns, for example. The platinum-containing layer 320 may be formed, for example, using a sputtering process, an evaporation process, or an MOCVD process. Other processes for forming the platinum-containing layer 320 are within the scope of the instant example.

A hard mask layer 374 is formed over a top surface 324 of the platinum-containing layer 320. In one version of the instant example, there may be native platinum oxide 322 on the top surface 324 of the platinum-containing layer 320 prior to forming the hard mask layer 374, as depicted in FIG. 3A. The native platinum oxide 322 may be formed, for example, by exposing the top surface 324 of the platinum-containing layer 320 to air prior to forming the hard mask layer 374. In another version of the instant example, the top surface 324 of the platinum-containing layer 320 may be free of platinum oxide, for example by forming the hard mask layer 374 and the platinum-containing layer 320 in a same process tool, without exposing the top surface 324 of the platinum-containing layer 320 to an oxidizing ambient. In the instant example, the hard mask layer 374 may include one or more layers of dielectric material, such as silicon dioxide, silicon oxynitride, silicon nitride, aluminum oxide, or the like. The hard mask layer 374 has an etch rate in a wet etchant used to remove the platinum-containing layer 320 that is significantly lower than an etch rate of the platinum-containing layer 320 in the same wet etchant. In the instant example, a thickness of the hard mask layer 374 is sufficient to remain intact through subsequent process steps, including removal of the native platinum oxide 322 in some areas, and removal of the platinum-containing layer 320 in the same areas. A thickness of the hard mask layer 374 may be limited by practical considerations of subsequent fabrication steps for forming the microelectronic device 300, such as planarity of subsequently formed layers of dielectric materials and metals, and etching vias through the hard mask layer 374. For example, in a version of the instant example in which the platinum-containing layer 320 is formed on field oxide or on a dielectric layer in the first or second metallization levels, the thickness of the hard mask layer 374 may be 10 nanometers to 200 nanometers. In a version of the instant example in which the platinum-containing layer 320 is formed on a dielectric layer close to the top metallization level, the thickness of the hard mask layer 374 may be 10 nanometers to 1000 nanometers.

An etch mask 376 may be formed over the hard mask layer 374 to cover an area for a platinum-containing component. The etch mask 376 may include photoresist, formed by a photolithographic process. The etch mask 376 may include an anti-reflection layer such as BARC. The etch mask 376 exposes the hard mask layer 374 in areas outside the area for the platinum-containing component.

Figure 3B:
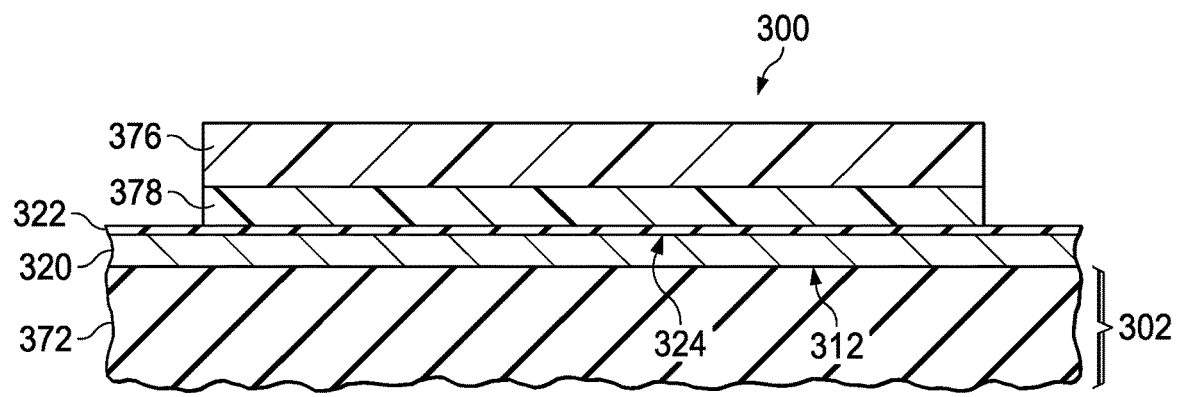

Referring to FIG. 3B, the hard mask layer 374 of FIG. 3A is removed where exposed by the etch mask 376 to form a hard mask 378. The hard mask layer 374 may be removed, for example, by an RIE process or other plasma etch process. Alternatively, the hard mask layer 374 may optionally be removed by a wet etch process. The native platinum oxide 322 may be removed where exposed by the hard mask layer 374, but the native platinum oxide 322 may quickly form again upon exposure to an oxidizing ambient such as air.

The etch mask 376 is subsequently removed, leaving the hard mask 378 in place covering the area for the platinum-containing component. The etch mask 376 may be removed, for example by an asher process followed by a wet clean process.

In an alternate version of the instant example, the hard mask 378 may be formed by an additive process, that is, by forming hard mask material only where needed over the platinum-containing layer 320. Examples of the additive process may include an inkjet process, screen printing, electrostatic deposition, and direct laser transfer.

Figure 3C:
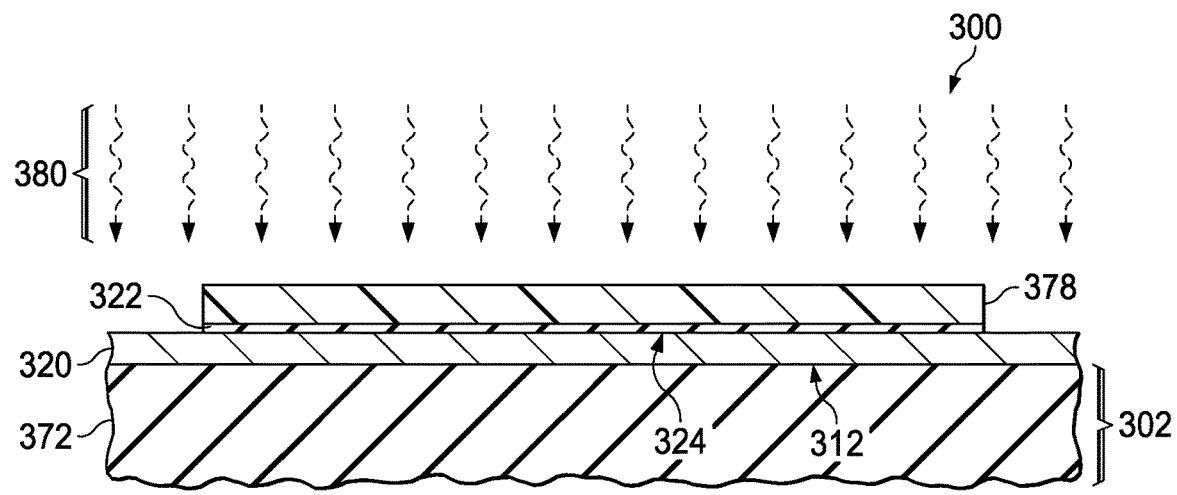

Referring to FIG. 3C, the platinum-containing layer 320 is heated in a non-oxidizing ambient, such as a vacuum or a low pressure ambient of nitrogen, argon, helium, or the like. The platinum-containing layer 320 may be heated, for example, by a radiant heating process 380 as indicated in FIG. 3C, or by a furnace process. The platinum-containing layer 320 is heated to a sufficient temperature for a sufficient time to remove the native platinum oxide 322 where exposed by the hard mask 378. For example, the platinum-containing layer 320 may be heated to 300° C. to 350° C. for 30 minutes to 120 minutes.

Figure 3D:
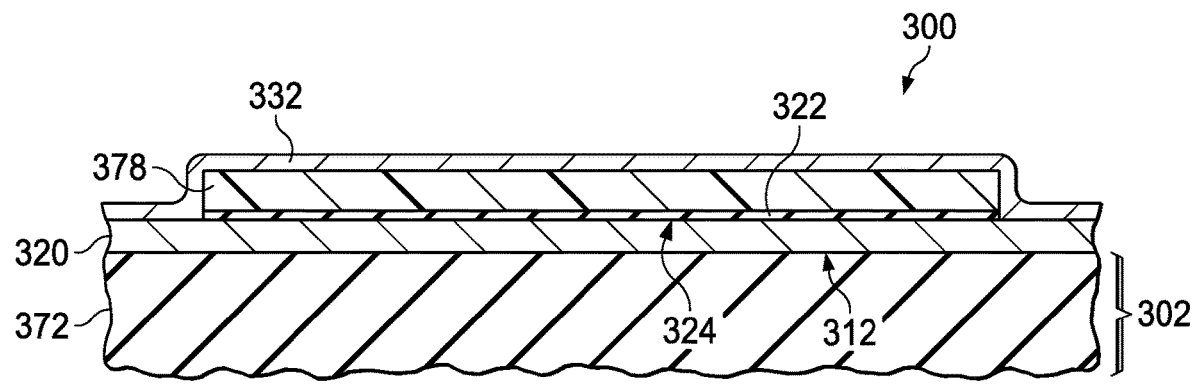

Referring to FIG. 3D, a cap layer 332 is formed over the hard mask 378 and on the top surface 324 of the platinum-containing layer 320 where exposed by the hard mask 378, so that an interface between the cap layer 332 and the platinum-containing layer 320 is free of platinum oxide. For example, the cap layer 332 may be formed in a same tool used to heat the platinum-containing layer 320 as disclosed in reference to FIG. 3C, without exposing the top surface 324 of the platinum-containing layer 320 to an oxidizing ambient. The cap layer 332 may have a composition and thickness as disclosed in reference to FIG. 1D, and may be formed by any of the processes disclosed in reference to FIG. 1D.

Figure 3E:
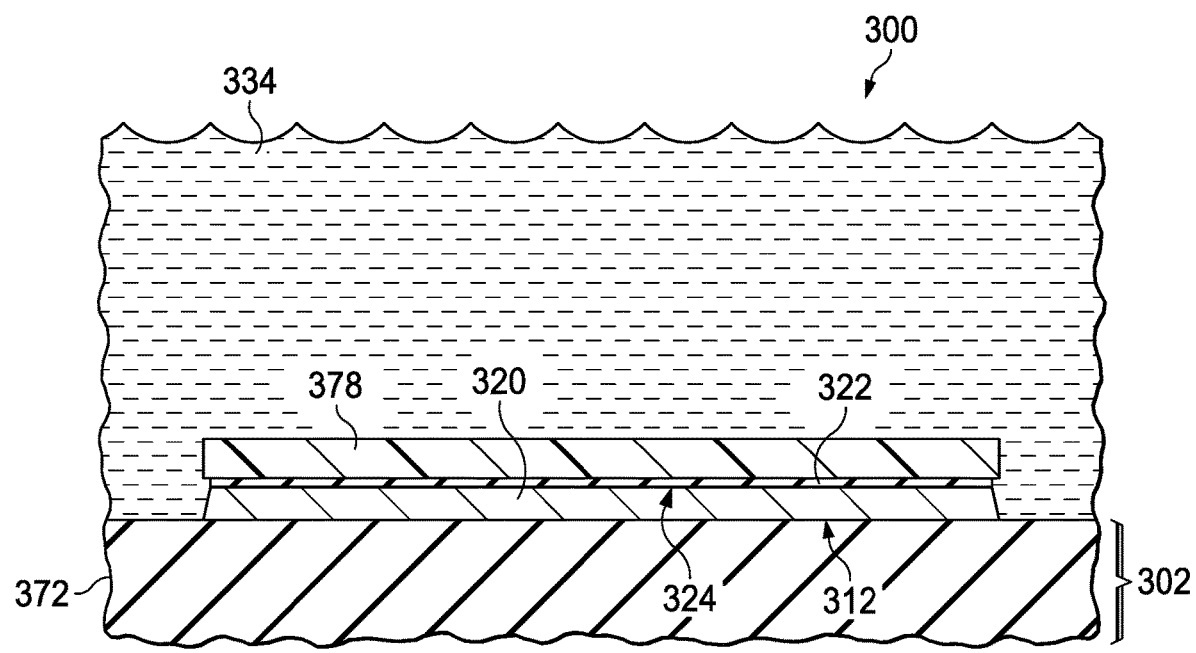

Referring to FIG. 3E, a wet etch process using a wet etchant 334 removes the cap layer 332 of FIG. 3D and the platinum-containing layer 320, where exposed by the hard mask 378, as described in reference to FIG. 1E through FIG. 1G. The wet etchant 334 may have any of the compositions disclosed in reference to FIG. 1E. FIG. 3E depicts the microelectronic device 300 at the completion of the wet etch process. The hard mask 378, and the native platinum oxide 322, if present, prevent the wet etchant 334 from removing the platinum-containing layer 320 under the hard mask 378, because the hard mask 378) has a sufficiently low etch rate in the wet etchant 334. Forming the cap layer 332 on the platinum-containing layer 320 with no platinum oxide between, as described in reference to FIG. 3D, may enable the wet etch process to completely remove the platinum-containing layer 320 where exposed by the hard mask 378 without need for a long overetch, thus advantageously reducing undercut of the platinum-containing layer 320 under edges of the hard mask 378, and advantageously providing consistent lateral dimensions of the remaining platinum-containing layer 320.

Figure 3F:
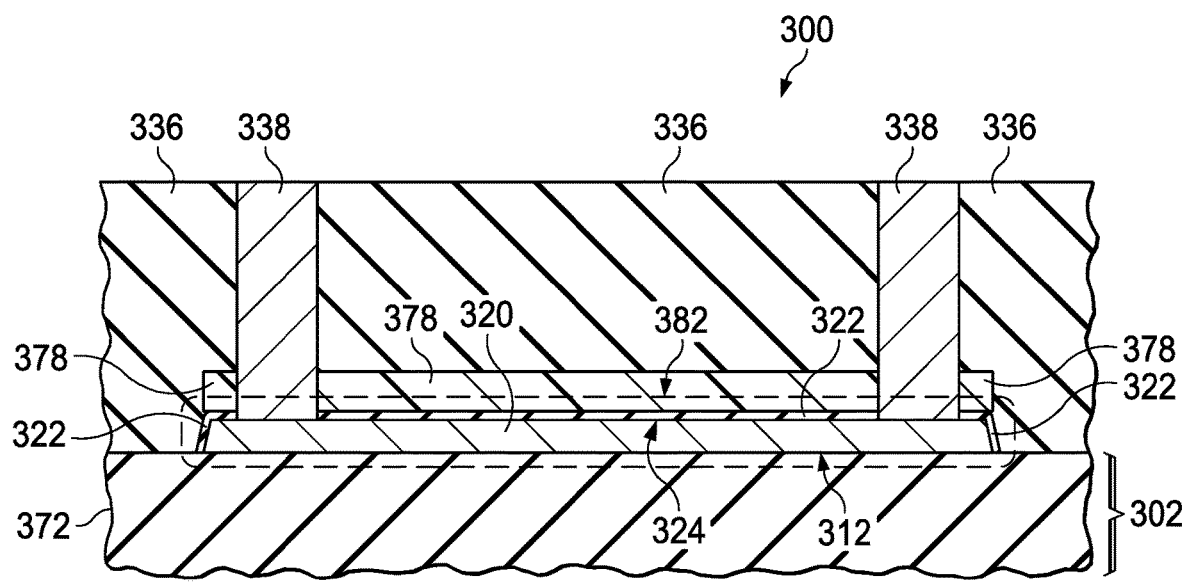

Referring to FIG. 3F, after the wet etch process of FIG. 3E is completed, additional native platinum oxide 322 may form on exposed lateral surfaces of the remaining platinum-containing layer 320. The remaining platinum-containing layer 320 provides the platinum-containing component 382, which may include, for example, a resistor, an interconnect, a sensor element, a thermocouple element, or a heater element.

In one version of the instant example, the hard mask 378 may be left in place, as depicted in FIG. 3F. In another version, the hard mask 378 may be removed after the wet etch process of FIG. 3E is completed.

A dielectric layer 336, which may be a PMD layer, an IMD layer, or an ILD layer, may be formed over an instant top surface of the microelectronic device 300. Vertical connections 338, which may be contacts or vias, may be formed through the dielectric layer 336, and through the hard mask 378, if present, to make electrical connections to the platinum-containing component 382. During formation of the vertical connections 338, the native platinum oxide 322 on the top surface 324 of the platinum-containing layer 320 is easily removed to enable low resistance between the vertical connections 338 and the platinum-containing component 382.

Figure 4A:
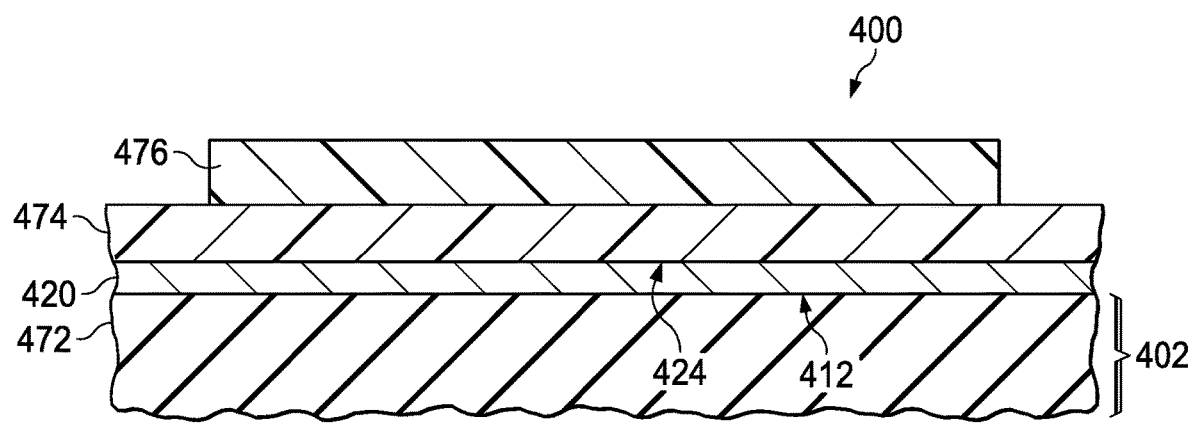
FIG. 4A through FIG. 4H are cross sections of a microelectronic device with a platinum-containing layer, depicted in successive stages of another example method of formation.

FIG. 4A through FIG. 4H are cross sections of a microelectronic device with a platinum-containing layer, depicted in successive stages of another example method of formation. Referring to FIG. 4A, the microelectronic device 400 has a substrate 402 which, in the instant example, includes a dielectric material 472 extending to a top surface 412 of the substrate 402. A platinum-containing layer 420 is formed over the top surface 412 of the substrate 402. The platinum-containing layer 420 may have a composition and structure similar to the platinum-containing layer 320 of FIG. 3A.

A hard mask layer 474 is formed on a top surface 424 of the platinum-containing layer 420. In the instant example, the hard mask layer 474 is electrically conductive, and is formed on the top surface 424 of the platinum-containing layer 420 so that there is no platinum oxide between the hard mask layer 474 and the platinum-containing layer 420. The hard mask layer 474 makes an electrical connection to the platinum-containing layer 420, for example with a contact resistivity less than $10^{-8}$ ohm-cm$^2$. In one version of the instant example, this may be accomplished by forming the hard mask layer 474 and the platinum-containing layer 420 in a same process tool, without exposing the top surface 424 of the platinum-containing layer 420 to an oxidizing ambient. In another version of the instant example, platinum oxide on the top surface 424 of the platinum-containing layer 420 may be removed prior to forming the hard mask layer 474. The hard mask layer 474 may include one or more layers of electrically conductive material with an etch rate in a wet etchant used to remove the platinum-containing layer 420 that is significantly lower than an etch rate of the platinum-containing layer 420 in the same wet etchant. The hard mask layer 474 may include, for example, titanium, titanium nitride, tungsten, titanium tungsten, tantalum, tantalum nitride, or chromium. In the instant example, a thickness of the hard mask layer 474 is sufficient to remain intact through subsequent process steps, including removal of platinum oxide from the platinum-containing layer 420 in some areas, and removal of the platinum-containing layer 420 in the same areas, and sufficient to provide landing pads for subsequently-formed contacts or vias. A thickness of the hard mask layer 474 may be limited by practical considerations of subsequent fabrication steps for forming the microelectronic device 400, such as planarity of subsequently formed layers of dielectric materials and metals. By way of example, the thickness of the hard mask layer 474 may be 30 nanometers to 200 nanometers.

An etch mask 476 is formed over the hard mask layer 474 to cover an area for a platinum-containing component. The etch mask 476 may be formed by a similar process to that disclosed in reference to the etch mask 376 of FIG. 3A.

Figure 4B:
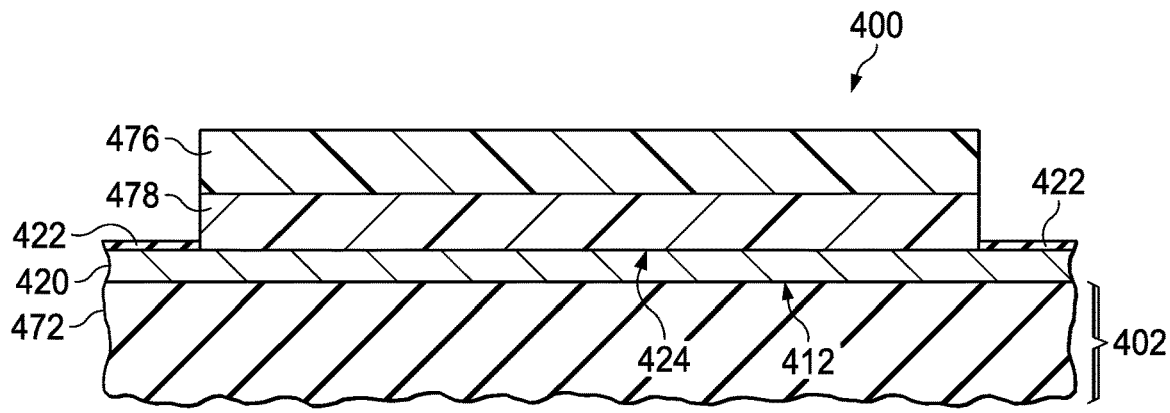

Referring to FIG. 4B, the hard mask layer 474 of FIG. 4A is removed where exposed by the etch mask 476 to form a hard mask 478. The hard mask layer 474 may be removed, for example, by an RIE process using halogen radicals, or other plasma etch process. Alternatively, the hard mask layer 474 may optionally be removed by a wet etch process using a mixture of etchants including nitric acid, phosphoric acid, hydrofluoric acid, hydrogen peroxide, or any combination thereof. Native platinum oxide 422 may form on the top surface 424 of the platinum-containing layer 420 where exposed by the hard mask 478. The etch mask 476 is subsequently removed, leaving the hard mask 478 in place covering the area for the platinum-containing component.

Figure 4C:
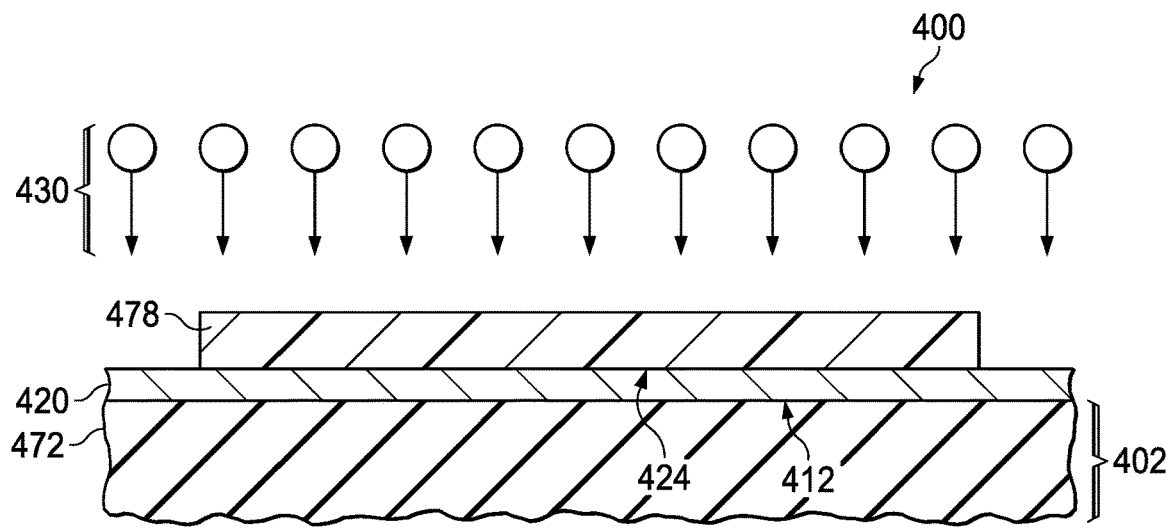

Referring to FIG. 4C, the native platinum oxide 422 of FIG. 4B is removed from the top surface 424 of the platinum-containing layer 420 where exposed by the hard mask 478. The native platinum oxide 422 may be removed by sputter etching using noble gas ions 430 such as helium or argon, as indicated in FIG. 4C. Alternatively, the native platinum oxide 422 may be removed by another method, such as heating the platinum-containing layer 420 in a non-oxidizing ambient, or by a plasma process using energetic halogen ions which removes the native platinum oxide 422 by a combination of physical and chemical mechanisms. Other processes for removing the native platinum oxide 422 are within the scope of the instant example.

Figure 4D:
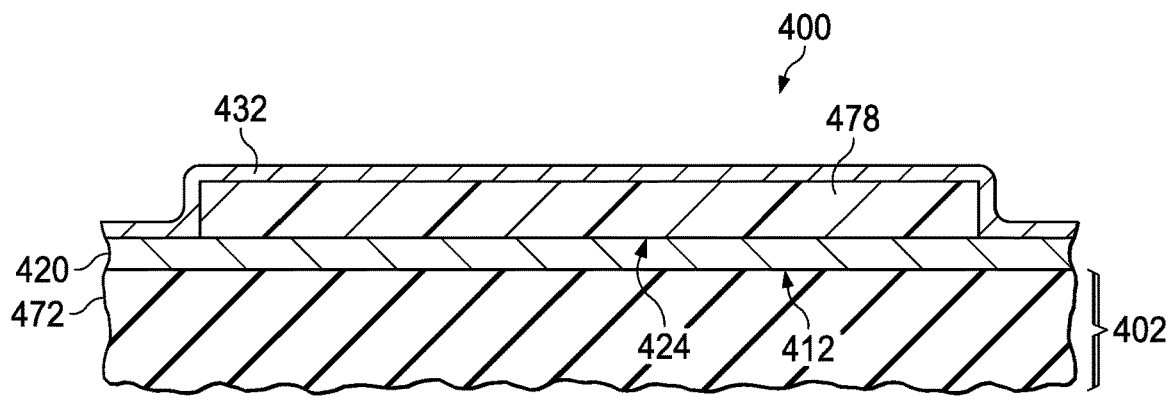

Referring to FIG. 4D, a cap layer 432 is formed over the hard mask 478 and on the top surface 424 of the platinum-containing layer 420 where exposed by the hard mask 478, so that an interface between the cap layer 432 and the platinum-containing layer 420 is free of platinum oxide. For example, the cap layer 432 may be formed in a same tool used to remove the platinum-containing layer 420 as disclosed in reference to FIG. 4C, without exposing the top surface 424 of the platinum-containing layer 420 to an oxidizing ambient. The cap layer 432 may have a composition and thickness as disclosed in reference to FIG. 1D, and may be formed by any of the processes disclosed in reference to FIG. 1D.

Figure 4E:
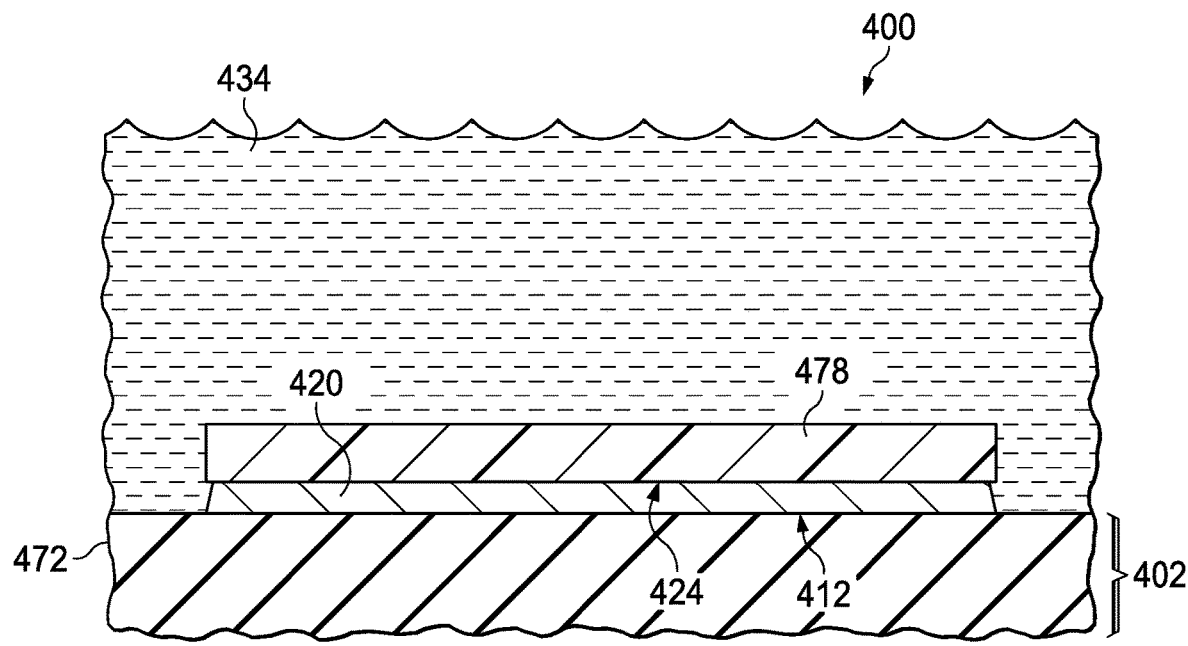

Referring to FIG. 4E, a wet etch process using a wet etchant 434 removes the cap layer 432 of FIG. 4D and the platinum-containing layer 420, where exposed by the hard mask 478, as described in reference to FIG. 1E through FIG. 1G. The wet etchant 434 may have any of the compositions disclosed in reference to FIG. 1E. FIG. 4E depicts the microelectronic device 400 at the completion of the wet etch process. The hard mask 478 prevents the wet etchant 434 from removing the platinum-containing layer 420 under the hard mask 478, because the hard mask 478) has a sufficiently low etch rate in the wet etchant 434. Forming the cap layer 432 on the platinum-containing layer 420 with no platinum oxide between, as described in reference to FIG. 4D, may enable the wet etch process to completely remove the platinum-containing layer 420 where exposed by the hard mask 478 without need for a long overetch, thus advantageously reducing undercut of the platinum-containing layer 420 under edges of the hard mask 478, and advantageously providing consistent lateral dimensions of the remaining platinum-containing layer 420.

Figure 4F:
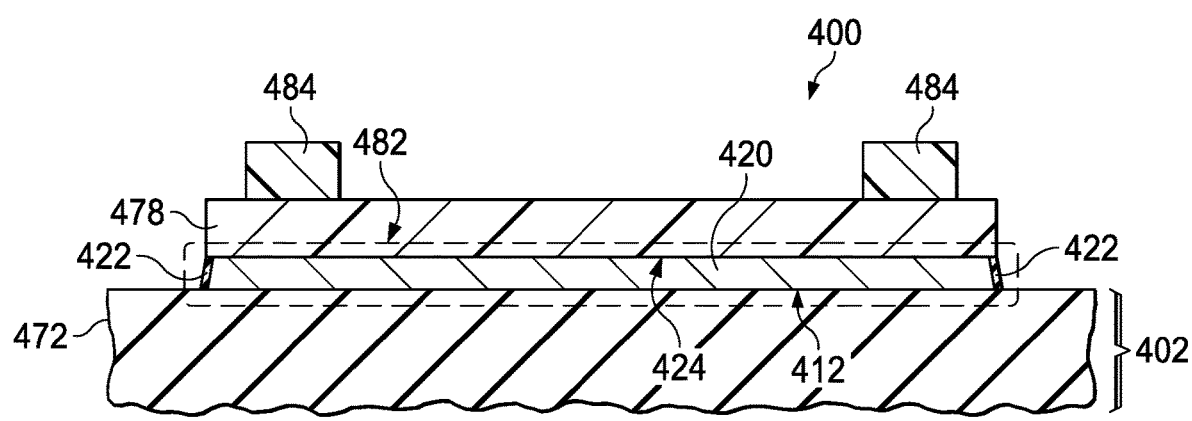

Referring to FIG. 4F, the remaining platinum-containing layer 420 provides the platinum-containing component 482, which may include, for example, a resistor, an interconnect, a sensor element, a thermocouple element, or a heater element. A landing pad mask 484 is formed over the hard mask 478 to cover areas for landing pads on the platinum-containing component 482. The landing pad mask 484 may include photoresist, and may optionally include a BARC layer. New native platinum oxide 422 may form on exposed surfaces of the platinum-containing component 482, as depicted in FIG. 4F.

Figure 4G:
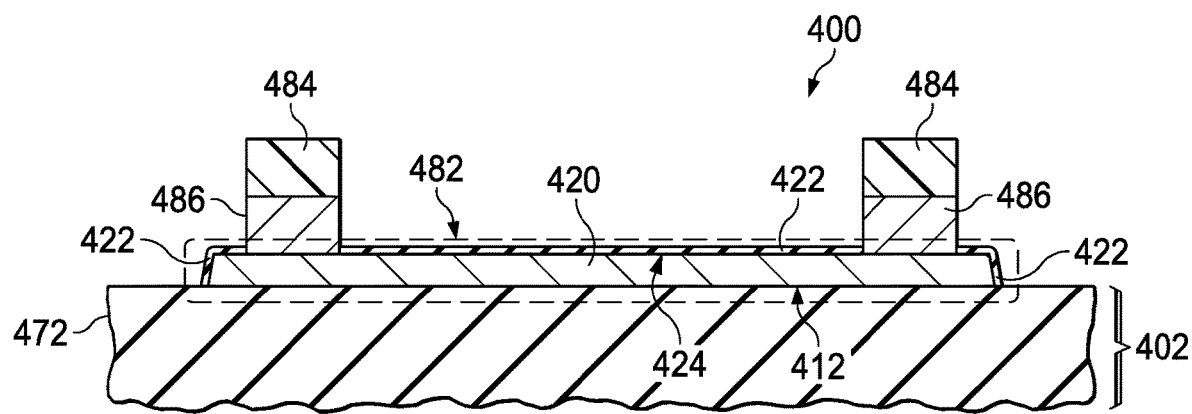

Referring to FIG. 4G, the hard mask 478 of FIG. 4F is removed where exposed by the landing pad mask 484, to form landing pads 486 of remaining portions of the hard mask 478. The hard mask 478 may be removed, for example, by any of the processes disclosed in reference to removal of the hard mask layer 474 of FIG. 4A, discussed in reference to FIG. 4B. Additional native platinum oxide 422 may form on surfaces of the platinum-containing component 482 which are exposed by removal of the hard mask 478, as depicted in FIG. 4G. The landing pad mask 484 is subsequently removed, for example by an asher process followed by a wet clean process.

Figure 4H:
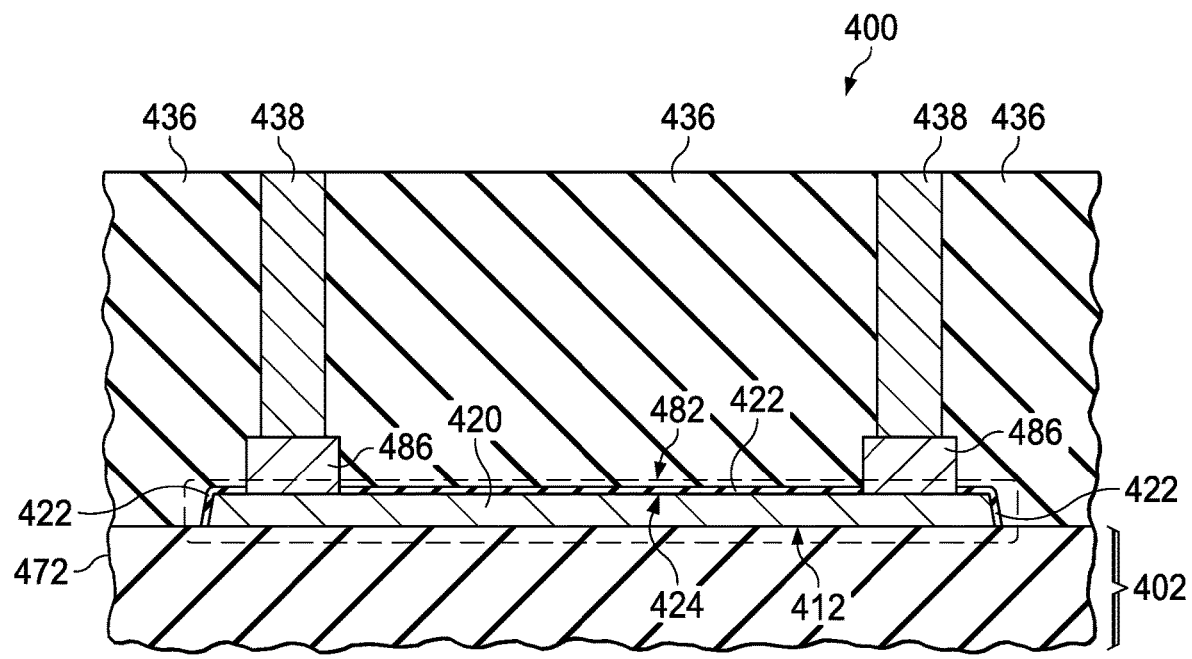

Referring to FIG. 4H, a dielectric layer 436, which may be a PMD layer, an 1 MB layer, or an ILD layer, may be formed over an instant top surface of the microelectronic device 400. Vertical connections 438, which may be contacts or vias, are formed through the dielectric layer 436, to make electrical connections to the landing pads 486. Absence of platinum oxide between the landing pads 486 and the platinum-containing component 482 may advantageously result in low electrical resistance between the landing pads 486 and the platinum-containing component 482.

Figure 5A:
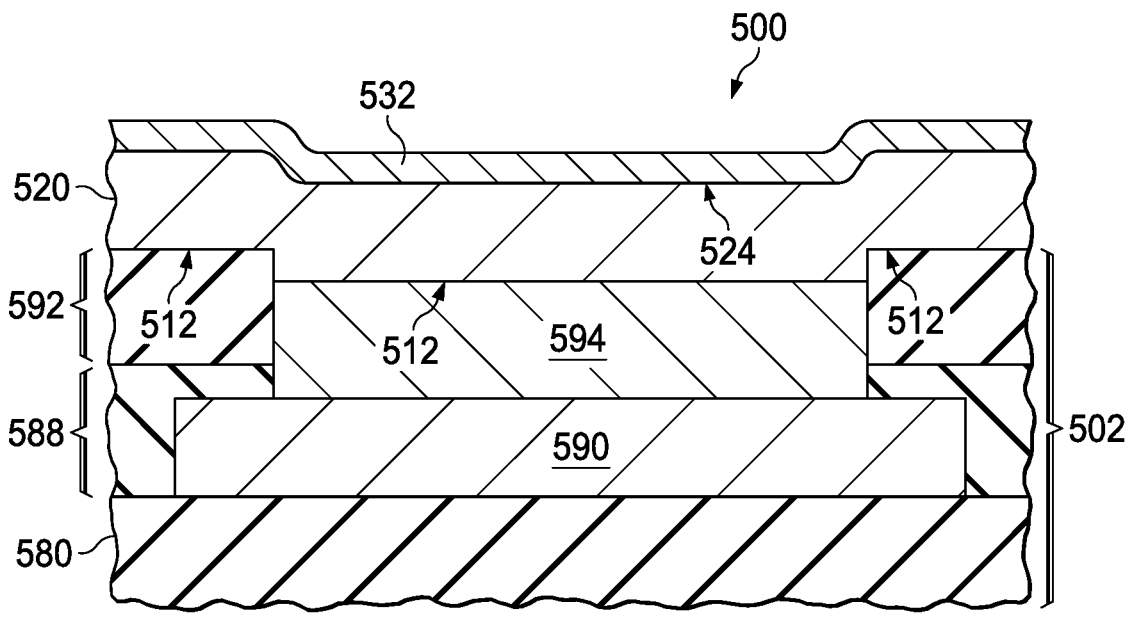
FIG. 5A through FIG. 5F are cross sections of a microelectronic device with a platinum-containing layer in a bond pad, depicted in successive stages of another example method of formation.

FIG. 5A through FIG. 5F are cross sections of a microelectronic device with a platinum-containing layer in a bond pad, depicted in successive stages of another example method of formation. Referring to FIG. 5A, the microelectronic device 500 has a substrate 502 which, in the instant example, includes an ILD layer 580, an IMD layer 588 over the ILD layer 580, an interconnect 590 over the ILD layer 580 and laterally surrounded by the IMD layer 588, a PO layer 592 over the IMD layer 588, and a bond pad underlayer 594 on the interconnect 590. The PO layer 592 exposes at least a portion of the bond pad underlayer 594 in an area for a bond pad. The PO layer 592 may include silicon dioxide, silicon oxynitride, silicon nitride, or the like. The bond pad underlayer 594 may include one or more layers of nickel, palladium, or other metal suitable for support of the bond pad. The bond pad underlayer 594 may be formed, for example, using electroless plating.

A platinum-containing layer 520 is formed over a top surface 512 of the substrate 502, contacting the bond pad underlayer 594. An optional adhesion metal layer, not shown in FIG. 5A, may be formed over the top surface 512 of the substrate 502 prior to forming the platinum-containing layer 520, is within the scope of the instant example. In the instant example, the platinum-containing layer 520 will provide a bond pad for wire bonding, and so may include primarily platinum or may consist essentially of platinum. The platinum-containing layer 520 may have a thickness of, for example, 1 micron to 5 microns.

A cap layer 532 is formed on a top surface 524 of the platinum-containing layer 520 so that an interface between the cap layer 532 and the platinum-containing layer 520 is free of platinum oxide. In one version of the instant example, the cap layer 532 may be formed in situ with the platinum-containing layer 520, that is, formed in a same process tool with the platinum-containing layer 520. In another version, platinum oxide may be removed from the top surface 524 of the platinum-containing layer 520 prior to forming the cap layer 532.

Figure 5B:
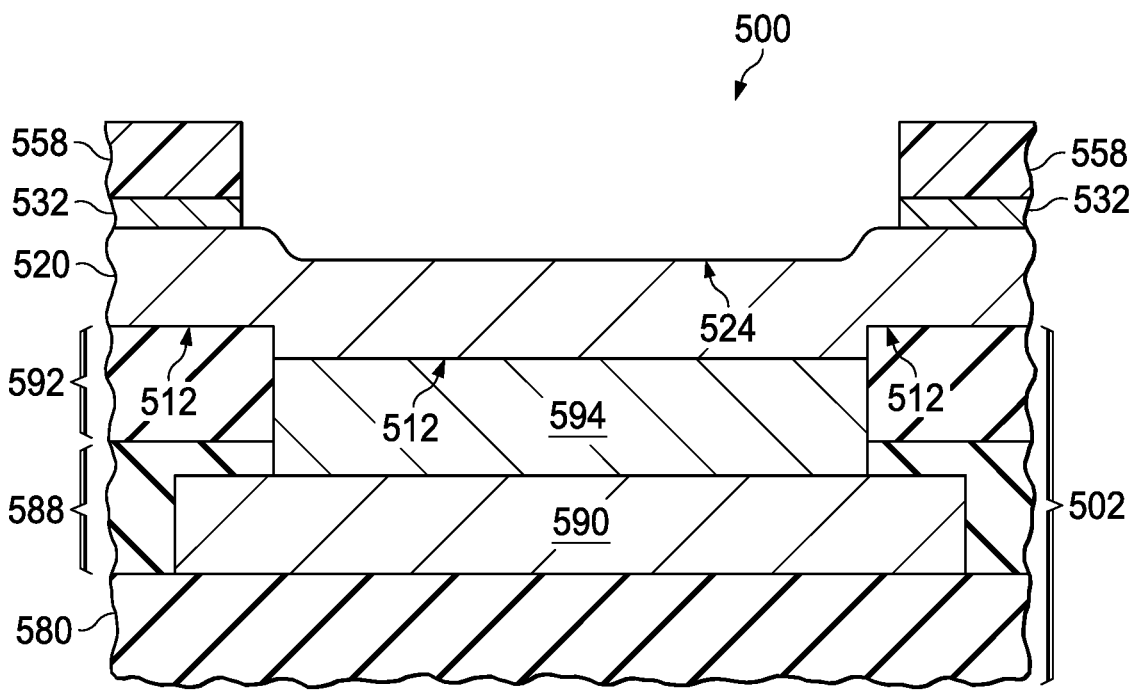

Referring to FIG. 5B, an etch mask 558 is formed over the cap layer 532. The etch mask 558 exposes the cap layer 532 in an area for the bond pad. The cap layer 532 is removed where exposed by the etch mask 558. The cap layer 532 may be removed by a plasma etch, by a wet etch, or by another process. The etch mask 558 may be subsequently removed prior to proceeding to a platinum oxide formation step, or may be left in place and removed after the platinum oxide formation step is completed.

Figure 5C:
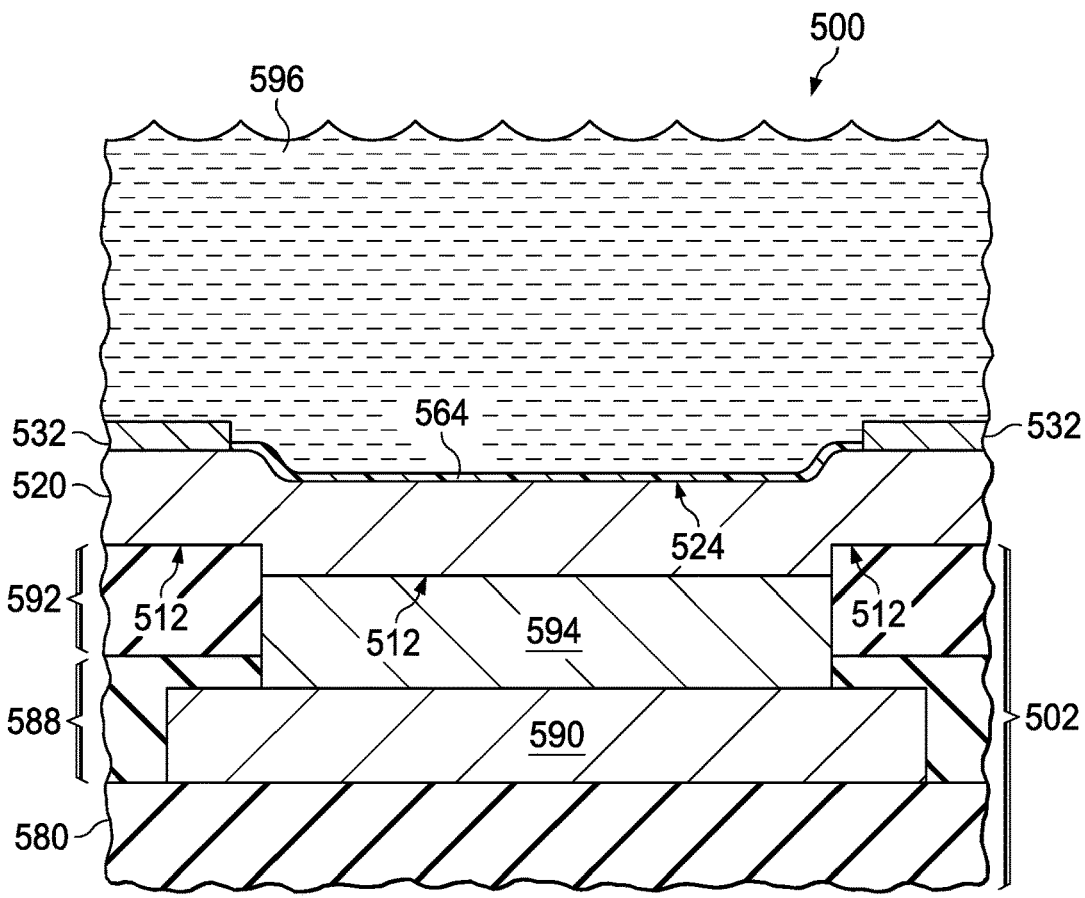

Referring to FIG. 5C, masking platinum oxide 564 is formed on the top surface 524 of the platinum-containing layer 520 where exposed by the cap layer 532. In the instant example, the masking platinum oxide 564 may be formed by an oxidizing wet reagent 596, as depicted in FIG. 5C. The oxidizing wet reagent 596 may include, for example, hydrogen peroxide, nitric acid, or the like. Other processes for forming the masking platinum oxide 564 are within the scope of the instant example.

Figure 5D:
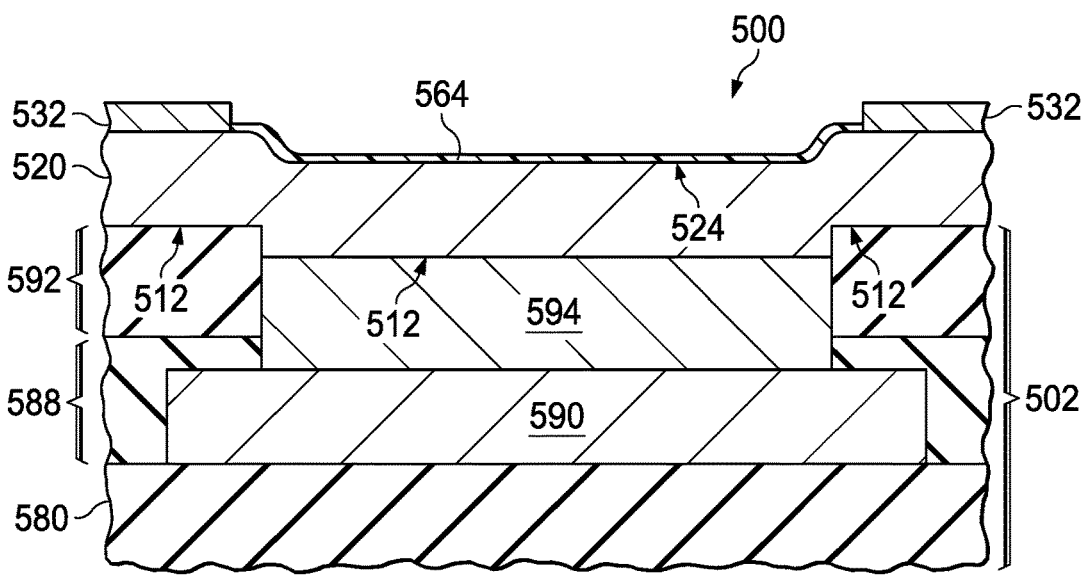

Referring to FIG. 5D, the microelectronic device 500 is removed from contact with the oxidizing wet reagent 596 of FIG. 5C. The masking platinum oxide 564 extends over the area for the bond pad.

Figure 5E:
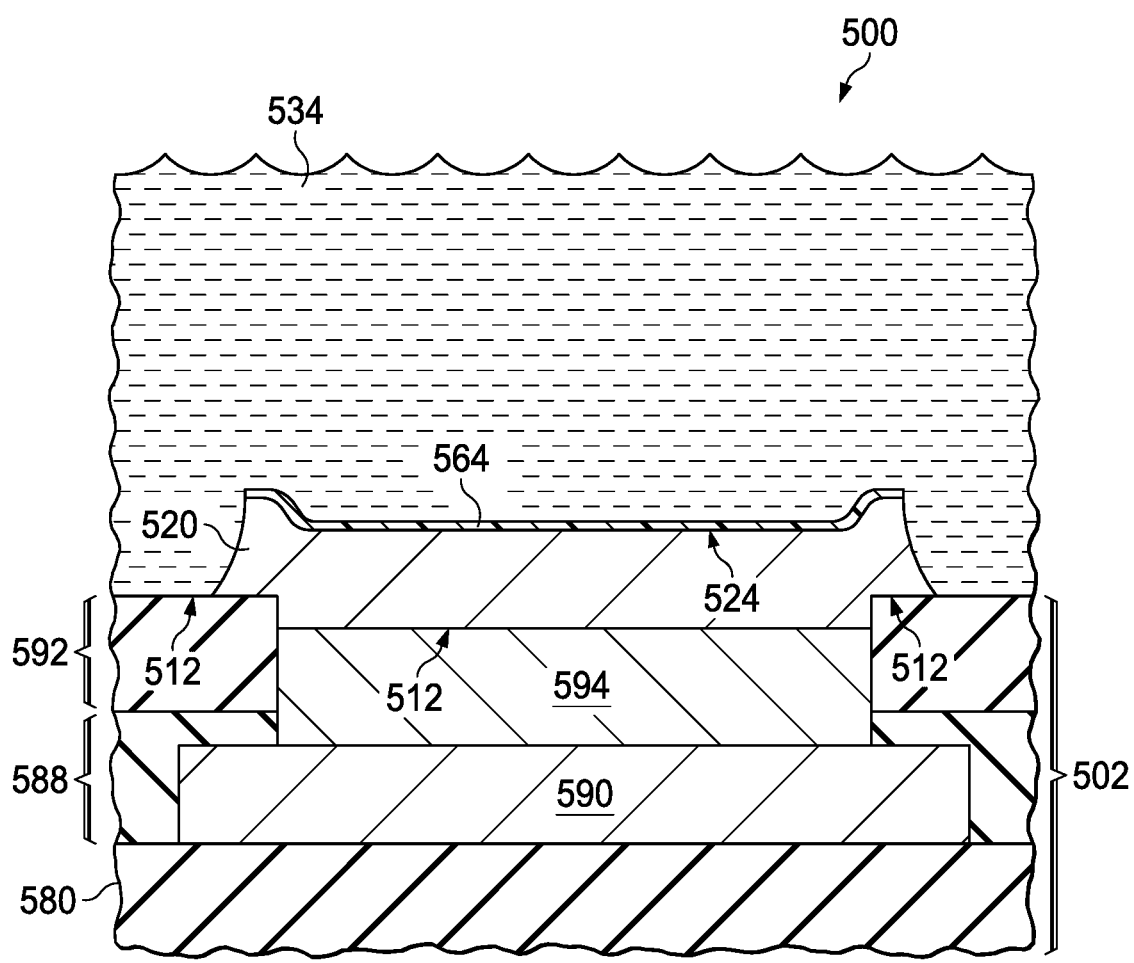

Referring to FIG. 5E, a wet etch process using a wet etchant 534 removes the cap layer 532 of FIG. 5D and the platinum-containing layer 520, where exposed by the masking platinum oxide 564, as described in reference to FIG. 1E through FIG. 1G. The wet etchant 534 may have any of the compositions disclosed in reference to FIG. 1E. FIG. 5E depicts the microelectronic device 500 at the completion of the wet etch process. The masking platinum oxide 564 prevents the wet etchant 534 from removing the platinum-containing layer 520 under the masking platinum oxide 564. Forming the cap layer 532 on the platinum-containing layer 520 with no platinum oxide between, as described in reference to FIG. 5D, may provide the advantage of low overetch and hence low undercut and consistent lateral dimensions, as discussed in reference to other examples herein.

Figure 5F:
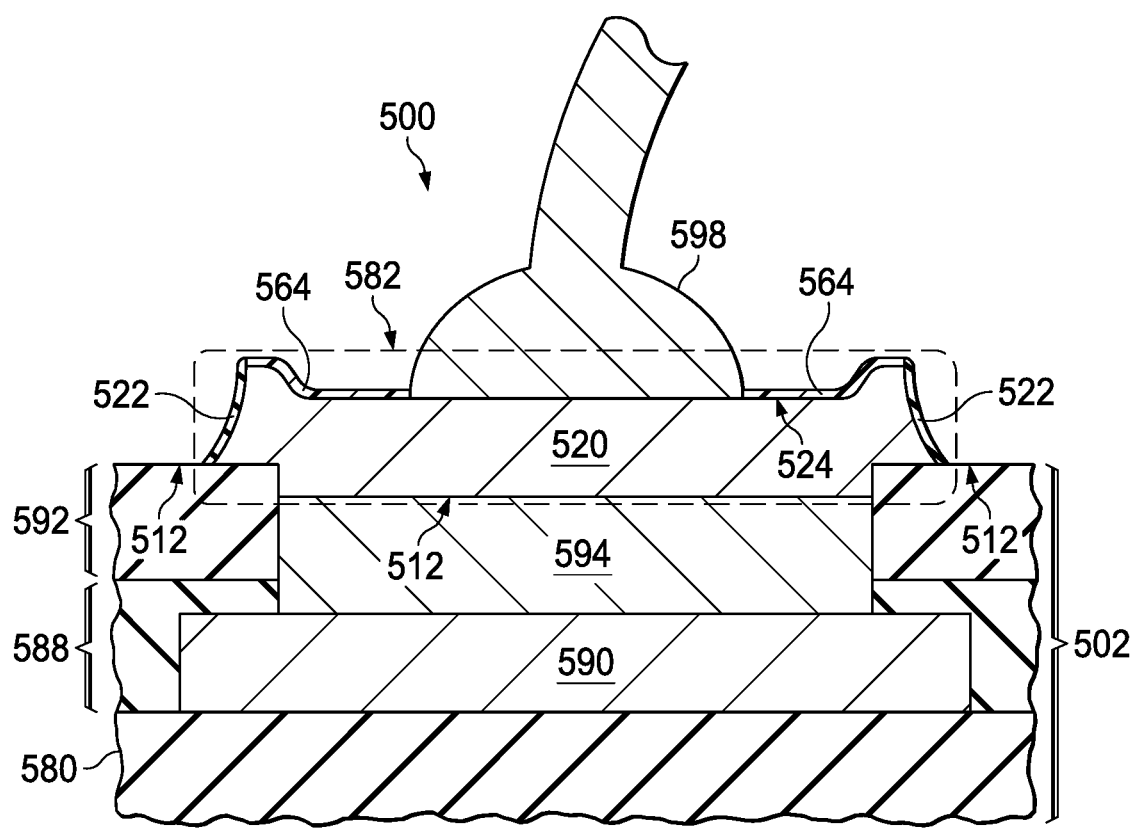

Referring to FIG. 5F, the remaining platinum-containing layer 520 provides the bond pad 582, which makes electrical connection to the interconnect 590 through the bond pad underlayer 594. Native platinum oxide 522 may form on exposed lateral surfaces of the bond pad 582.

A bond connection 598, depicted in FIG. 5F as a wire bond 598, may be subsequently formed on the bond pad 582 by the bonding operation. Wire bonds with gold and platinum wires have been demonstrated on platinum pads with the masking platinum oxide 564 in place, using ultrasonic bonding processes. The process of wire bonding breaks through the masking platinum oxide 564, resulting in direct contact of the wire bond 598 to the platinum containing layer 520. Alternatively, the bond connection 598 may include a bump bond having indium and other metals, plated onto the bond pad 582. The process of forming the bump bond, including a reflow operation in which the bump bond is melted, results in direct contact of the bump bond metal to the platinum containing layer 520. Forming the bond pad 582 of platinum-containing metal may provide a desired reliability for the microelectronic device 500 compared to aluminum or another more reactive metal.

Figure 6A:
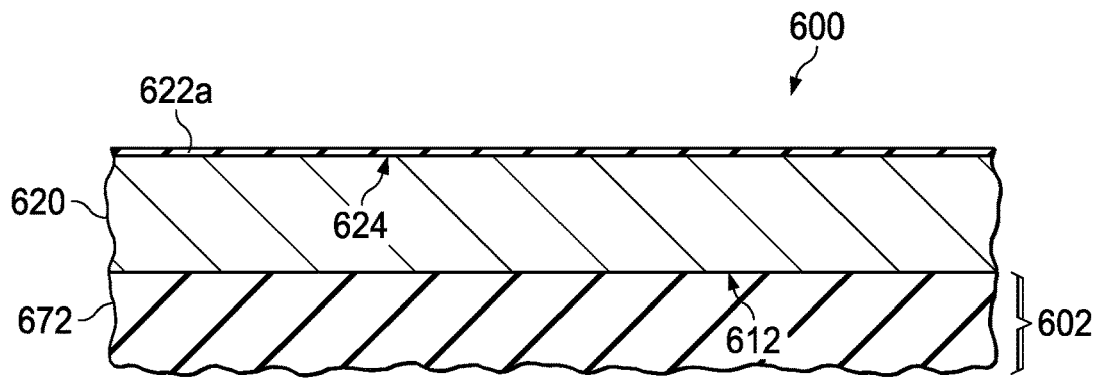
FIG. 6A through FIG. 6I are cross sections of a microelectronic device with a patterned platinum-containing layer, depicted in successive stages of a further example method of formation.

FIG. 6A through FIG. 6I are cross sections of a microelectronic device with a patterned platinum-containing layer, depicted in successive stages of a further example method of formation. Referring to FIG. 6A, the microelectronic device 600 has a substrate 602 which, in the instant example, includes a dielectric material 672 extending to a top surface 612 of the substrate 602. A platinum-containing layer 620 is formed over the top surface 612 of the substrate 602. The platinum-containing layer 620 may have a composition and structure similar to the platinum-containing layer 620 disclosed in reference to FIG. 3A. In one version of the instant example, there may be native platinum oxide 622a on a top surface 624 of the platinum-containing layer 620, as depicted in FIG. 6A.

Figure 6B:
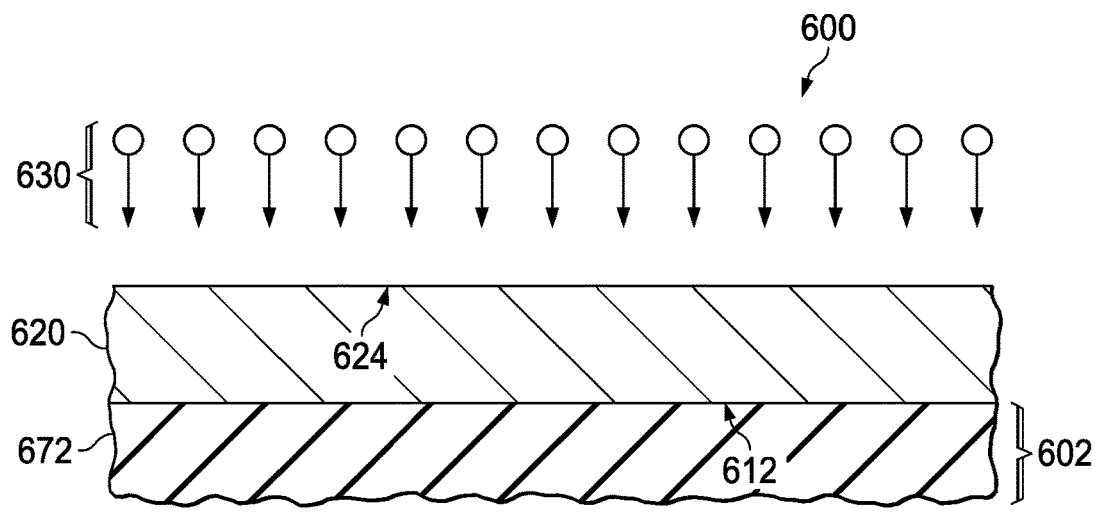

Referring to FIG. 6B, the native platinum oxide 622a of FIG. 6A is removed from the top surface 624 of the platinum-containing layer 620. In one version of the instant example, the native platinum oxide 622a may be removed by ions 630 of a sputter etch process, as depicted in FIG. 6B. In another version, the native platinum oxide 622a may be removed heating the platinum-containing layer 620. Other methods of removing the native platinum oxide 622a are within the scope of the instant example.

Figure 6C:
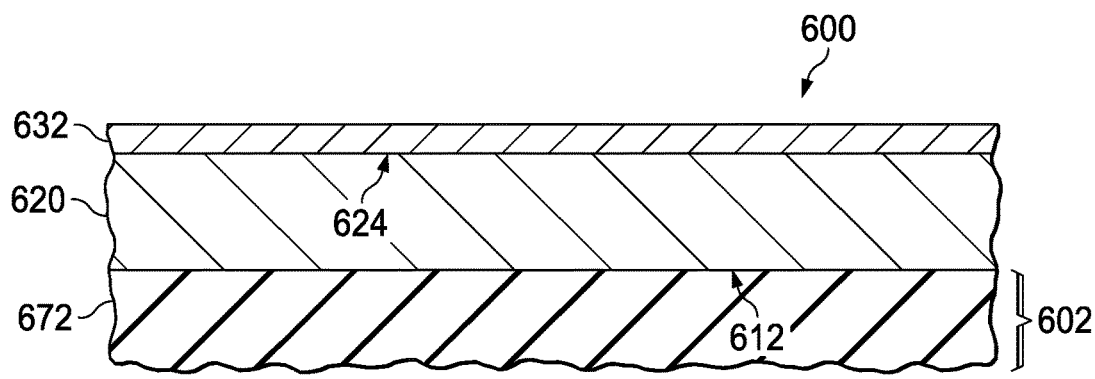

Referring to FIG. 6C, a cap layer 632 is formed on the top surface 624 of the platinum-containing layer 620, so that an interface between the cap layer 632 and the platinum-containing layer 620 is free of platinum oxide. In the instant example, this may be accomplished by forming the cap layer 632 without exposing the top surface 624 of the platinum-containing layer 620 to an oxidizing ambient after removing the native platinum oxide 622a of FIG. 6A. In an alternative version of the instant example, the cap layer 632 may be formed on the platinum-containing layer 620 without allowing the native platinum oxide 622a to form in the first place. The cap layer 632 is etchable in a same wet etchant that is subsequently used to remove at least a portion of the platinum-containing layer 620. The cap layer 632 may have a composition and thickness as disclosed in reference to FIG. 1D, and may be formed by any of the processes disclosed in reference to FIG. 1D.

Figure 6D:
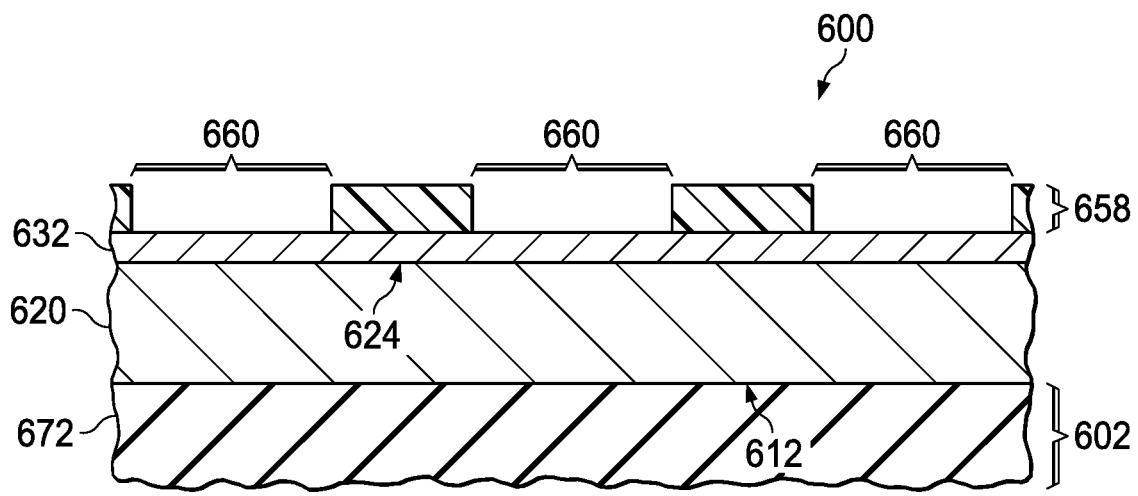

Referring to FIG. 6D, an etch mask 658 is formed over the cap layer 632. The etch mask 658 exposes an area 660 for a platinum-containing structure. In one version of the instant example, the etch mask 658 may include resist, formed by a lithographic process, such as a photolithographic process or an electron beam lithographic process. In another version, the etch mask 658 may include organic polymer material formed by an additive process. In a further version, the etch mask 658 may include inorganic material, formed by a mask and etch process, or by an additive process.

Figure 6E:
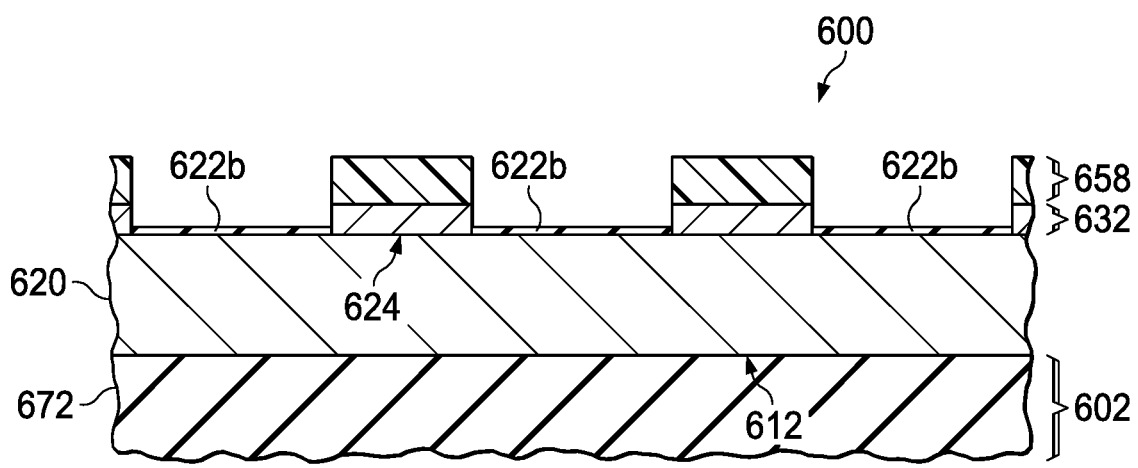

Referring to FIG. 6E, the cap layer 632 is removed where exposed by the etch mask 658. The cap layer 632 may be removed by a plasma etch process, by a wet etch process, or by another method. A new layer of native platinum oxide 622b may form on the top surface 624 of the platinum-containing layer 620 where exposed by removal of the cap layer 632.

Figure 6F:
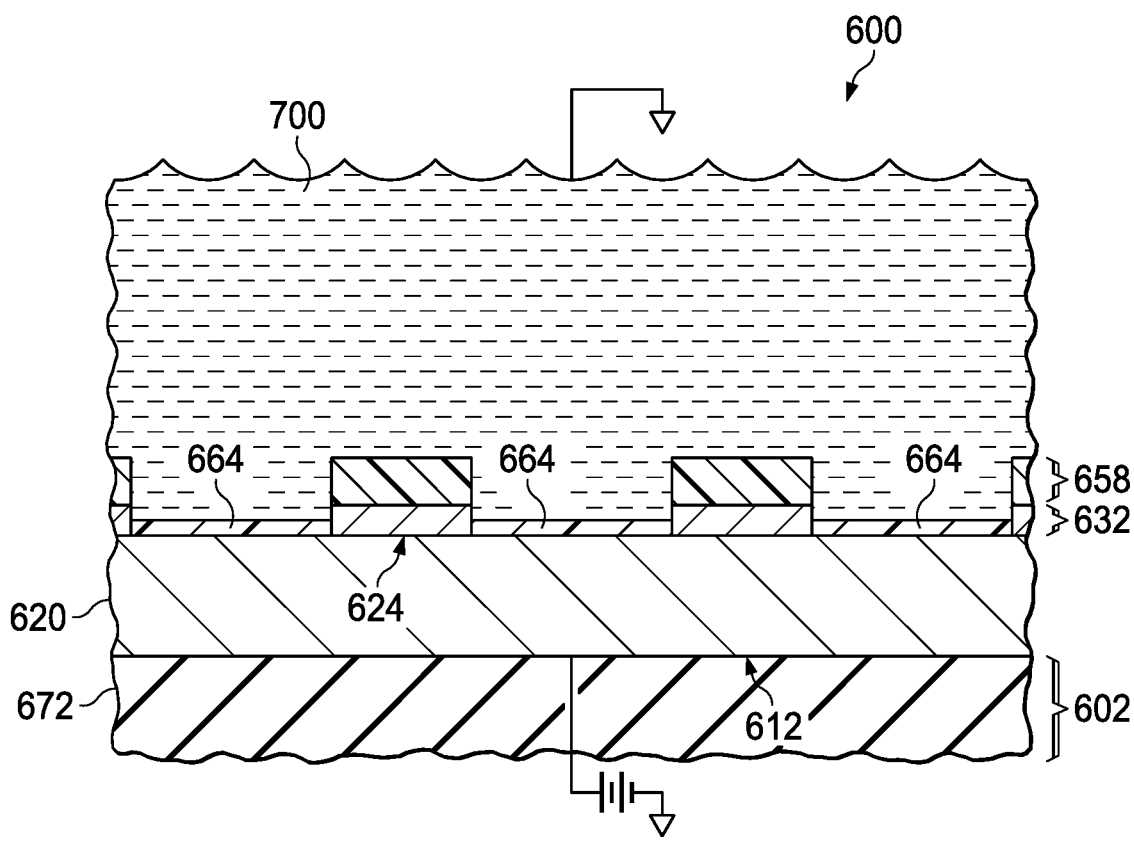

Referring to FIG. 6F, masking platinum oxide 664 is formed over the top surface 624 of the platinum-containing layer 620 where exposed by the cap layer 632. The masking platinum oxide 664 may replace or add to the native platinum oxide 622b of FIG. 6E. The masking platinum oxide 664 may be formed by an electrochemical process using an oxidizing electrolyte 700, wherein the platinum-containing layer 620 is biased to a positive electric potential relative to the oxidizing electrolyte 700, as indicated schematically in FIG. 6F. The oxidizing electrolyte 700 may include, for example, an aqueous solution of sulfuric acid ($H_2SO_4$), or an aqueous solution of sodium hydroxide (NaOH). The oxidizing electrolyte 700 may have other formulations. Alternatively, the masking platinum oxide 664 may be formed by other methods, such as any of the examples disclosed herein. The etch mask 658 may optionally be left in place during formation of the masking platinum oxide 664 to protect a top surface of the cap layer 632. The etch mask 658 is subsequently removed.

Figure 6G:
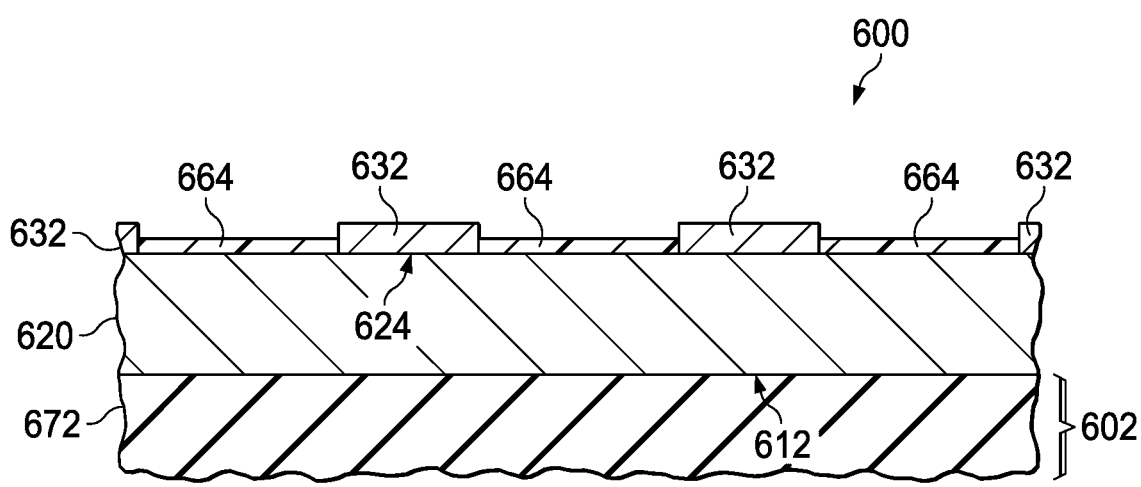

FIG. 6G depicts the microelectronic device 600 after the etch mask 658 of FIG. 6F is removed. The masking platinum oxide 664 covers the platinum-containing layer 620 in areas for the platinum-containing structure. The masking platinum oxide 664 is sufficiently thick to prevent removal of the platinum-containing layer 620 in the areas for the platinum-containing structure during a subsequent wet etch process.

Figure 6H:
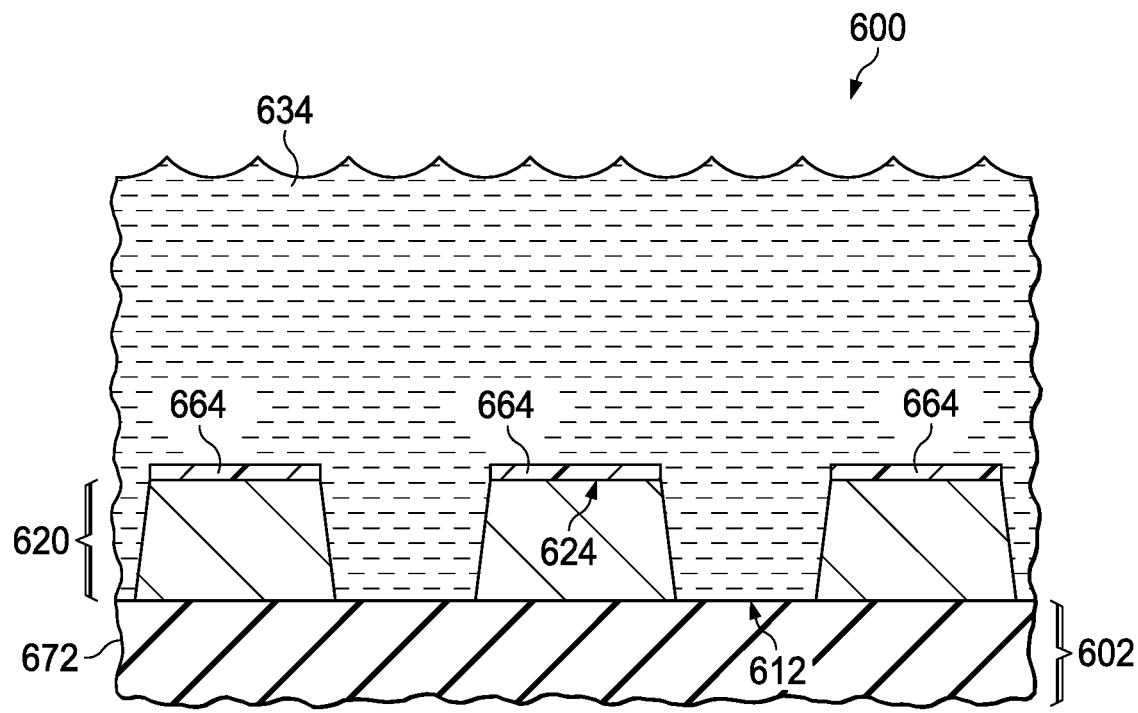

Referring to FIG. 6H, a wet etch process using a wet etchant 634 removes the cap layer 632 of FIG. 6G and the platinum-containing layer 620, where exposed by the masking platinum oxide 664, as described in reference to FIG. 1E through FIG. 1G. The wet etchant 634 may have any of the compositions disclosed in reference to FIG. 1E. FIG. 6H depicts the microelectronic device 600 at the completion of the wet etch process. The masking platinum oxide 664 prevents the wet etchant 634 from removing the platinum-containing layer 620 under the masking platinum oxide 664. Forming the cap layer 632 on the platinum-containing layer 620 with no platinum oxide between, as described in reference to FIG. 6A through FIG. 6C, may enable the wet etch process to completely remove the platinum-containing layer 620 where exposed by the masking platinum oxide 664 without need for a long overetch, thus advantageously providing consistent lateral dimensions of the remaining platinum-containing layer 620.

Figure 6I:
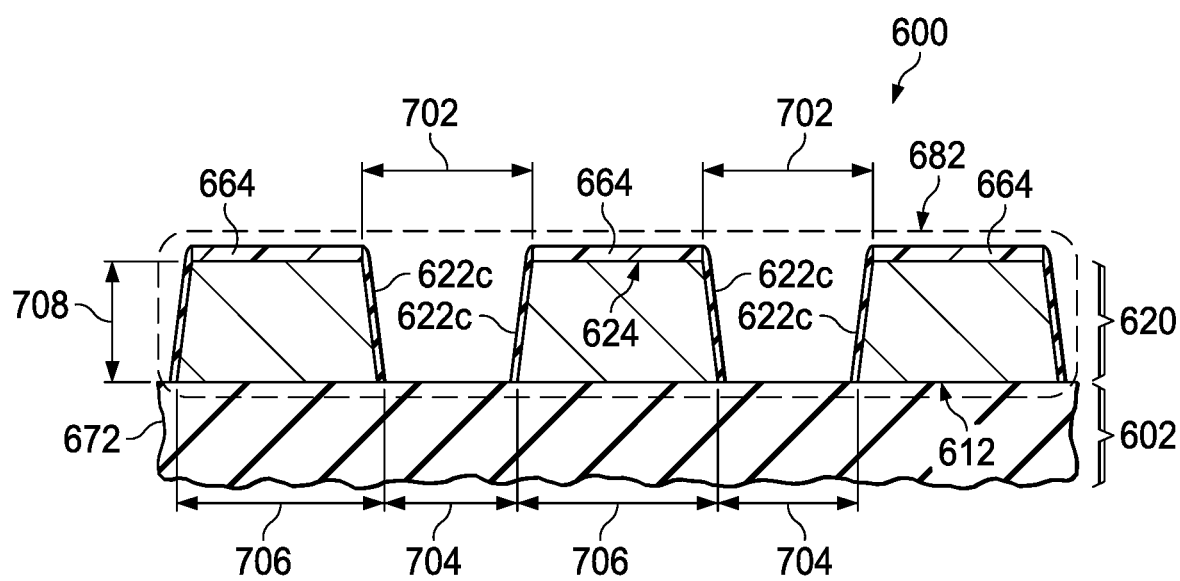

FIG. 6I depicts the microelectronic device 600 after being removed from exposure to the wet etchant 634 of FIG. 6H. Additional native platinum oxide 622c may form on all exposed surfaces of the platinum-containing layer 620. The platinum-containing layer 620 provides the platinum-containing structure 682, which may be part of a resistor, a sensor, an inductor, a capacitor, an interconnect, or such.

Forming the platinum-containing structure 682 by the wet etch process as described in reference to FIG. 6H may produce characteristic features in segments of the platinum-containing layer 620 in the platinum-containing structure 682. A first characteristic feature is that a first spacing 702 between adjacent segments of the platinum-containing layer 620 as measured from the top surface 624 of one segment to the top surface 624 of the adjacent segment, may be greater than a second spacing 704 between the same two adjacent segments as measured along the top surface 612 of the substrate 602. The first characteristic feature is a result of an isotropic nature of etching by the wet etchant 634 of FIG. 6H.

A second characteristic feature is that a width 706 of a segment as measured along the top surface 612 of the substrate 602 may be less than twice a thickness 708 of the same segment. Having the second characteristic feature in the platinum-containing layer 620 may advantageously provide a lower area for the platinum-containing structure 682 and thus for the microelectronic device 600. Attainment of the second characteristic feature is enabled by forming the cap layer 632 of FIG. 6C on the platinum-containing layer 620 with no platinum oxide, which in turn enables complete removal of the platinum-containing layer 620 in the second spacing 704 with a minimal overetch.

A third characteristic feature is that the second spacing 704 adjacent to a segment of the platinum-containing layer 620 may be less than twice the thickness 708 of the same segment. Having the third characteristic feature in the platinum-containing layer 620 may further provide a lower area for the platinum-containing structure 682 and thus for the microelectronic device 600. Attainment of the third characteristic feature is likewise enabled by forming the cap layer 632 of FIG. 6C on the platinum-containing layer 620 with no platinum oxide.

A fourth characteristic feature is an absence of redeposited sputter residue on the platinum-containing layer 620. Redeposited sputter residue, which may include polymer material and possibly platinum-containing material, is typical of structures formed by ion milling processes, and is not formed by the wet etch processes disclosed in the examples herein. Having the platinum-containing layer 620 free of redeposited platinum-containing residue may reduce contamination and associated defects, and thus advantageously provide more consistent performance and reliability for a circuit of the microelectronic device 600 containing the platinum-containing structure 682.

A fifth characteristic feature is an absence of platinum-containing residue on the top surface 612 of the substrate 602 adjacent to the segments of the platinum-containing layer 620. Platinum-containing residue on the top surface 612 of the substrate 602 is typical of platinum-containing structures formed by wet etch processes with platinum oxide on top surfaces of the platinum during the wet etch step. The platinum-containing residue results from the platinum oxide having a very low etch rate in the wet etchant used in the wet etch step. Attainment of the fifth characteristic feature is enabled by forming the cap layer 632 of FIG. 6C on the platinum-containing layer 620 with no platinum oxide between. Having the top surface 612 of the substrate 602 free of platinum-containing residue may advantageously improve a reliability of the microelectronic device 600. Forming microelectronic devices with platinum-containing structures as described in the examples herein may improve a yield of the microelectronic devices, which may advantageously provide lower fabrication costs for the yielded microelectronic devices.

While various embodiments of the present invention have been described above, it should be understood that they have been presented by way of example only and not limitation. Various elements of different examples may be combined to provide a different aspect of the invention. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a microelectronic device, comprising:
   providing a substrate;
   forming a platinum-containing layer over the substrate;
   forming a cap layer comprising one selected from a group consisting essentially of a cap layer that is primarily aluminum and a cap layer that is primarily copper over the platinum-containing layer, wherein an interface between the cap layer and the platinum-containing layer is free of platinum oxide; and
   removing the cap layer and at least a portion of the platinum-containing layer by a wet etch process, a same wet etchant of the wet etch process removing both the cap layer and at least the portion of the platinum containing layer, the cap layer having an etch rate at least twice the etch rate of the platinum containing layer in the same wet etchant.

2. The method of claim 1, wherein the cap layer includes primarily aluminum.

3. The method of claim 1, wherein the cap layer has a composition equal to a composition of a layer in an interconnect line of the microelectronic device.

4. The method of claim 1, wherein the wet etch process uses aqua regia.

5. The method of claim 1, wherein the cap layer is formed before the platinum-containing layer is exposed to an oxidizing ambient.

6. The method of claim 1, wherein the cap layer is formed after removing platinum oxide from a surface of the platinum-containing layer.

7. The method of claim 6, wherein removing the platinum oxide is performed using a sputter etch process.

8. The method of claim 6, wherein removing the platinum oxide is performed by heating the platinum-containing layer.

9. A method of forming a microelectronic device, comprising:
   providing a substrate;
   forming a platinum-containing layer over the substrate;
   forming a cap layer comprising one selected from a group consisting essentially of a cap layer that is primarily aluminum and a cap layer that is primarily copper over the platinum-containing layer, wherein an interface between the cap layer and the platinum-containing layer is free of platinum oxide;
   removing the cap layer and at least a portion of the platinum-containing layer by a wet etch process, a same wet etchant of the wet etch process removing both the cap layer and at least the portion of the platinum containing layer, the cap layer having an etch rate at least twice the etch rate of the platinum containing layer in the same wet etchant; and
   forming a hard mask over a portion of the platinum-containing layer prior to forming the cap layer, wherein the cap layer is formed over the hard mask.

10. The method of claim 9, wherein the hard mask includes dielectric material.

11. The method of claim 9, wherein the hard mask is electrically conductive.

12. The method of claim 11, further comprising patterning the hard mask on a remaining portion of the platinum-containing layer after removing the cap layer and the at least a portion of the platinum-containing layer using the wet etch process.

13. The method of claim 9, further comprising:
   removing a portion of the cap layer over a corresponding portion of the platinum-containing layer; and
   forming masking platinum oxide on the platinum-containing layer where exposed by the removing a portion of the cap layer, prior to removing the remaining cap layer and the portion of the platinum-containing layer using the wet etch process, wherein the masking platinum oxide blocks removal of the portion of the platinum-containing layer under the masking platinum oxide.

14. The method of claim 9, wherein the platinum-containing layer contacts exposed silicon containing semiconductor material; and further comprising heating the platinum-containing layer to form platinum silicide, prior to removing the cap layer and the at least a portion of the platinum-containing layer.

15. The method of claim 9, wherein at least a portion of the platinum containing layer provides a local interconnect.

16. The method of claim 9, wherein the local interconnect makes an electrical connection to platinum silicide.

17. The method of claim 9, wherein a least a portion of the platinum containing layer provides a bond pad.

* * * * *